(12) United States Patent
Kim et al.

(10) Patent No.: US 10,121,793 B2
(45) Date of Patent: Nov. 6, 2018

(54) SEMICONDUCTOR DEVICE HAVING SUPPORTERS AND METHOD OF MANUFACTURING THE SAME

(71) Applicant: Samsung Electronics Co., Ltd., Suwon-si, Gyeonggi-do (KR)

(72) Inventors: Kyung-Eun Kim, Seoul (KR); Yongkwan Kim, Yongin-si (KR); Semyeong Jang, Gunpo-si (KR); Jaehyoung Choi, Hwaseong-si (KR); Yoosang Hwang, Suwon-si (KR); Bong-Soo Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 159 days.

(21) Appl. No.: 15/083,819

(22) Filed: Mar. 29, 2016

(65) Prior Publication Data

US 2017/0077102 A1    Mar. 16, 2017

(30) Foreign Application Priority Data

Sep. 11, 2015 (KR) ........................ 10-2015-0129053

(51) Int. Cl.
*H01L 27/108* (2006.01)

(52) U.S. Cl.
CPC .. *H01L 27/10814* (2013.01); *H01L 27/10823* (2013.01); *H01L 27/10855* (2013.01); *H01L 27/10876* (2013.01)

(58) Field of Classification Search
CPC ..... H01L 27/108; H01L 23/522; H01L 29/06; H01L 29/45

See application file for complete search history.

(56) References Cited

U.S. PATENT DOCUMENTS

| 8,728,887 | B2 | 5/2014 | Lee et al. | |
|---|---|---|---|---|
| 8,941,164 | B2 | 1/2015 | Cho et al. | |
| 2009/0121315 | A1* | 5/2009 | Baars | H01L 28/90 257/532 |
| 2009/0294907 | A1* | 12/2009 | Tegen | H01L 28/86 257/535 |
| 2010/0233881 | A1 | 9/2010 | Min et al. | |
| 2013/0147048 | A1* | 6/2013 | Kuh | H01L 23/49827 257/768 |
| 2014/0004678 | A1 | 1/2014 | Lim et al. | |
| 2014/0252550 | A1 | 9/2014 | Chiang et al. | |

FOREIGN PATENT DOCUMENTS

KR  10-2009-0067606   6/2009

* cited by examiner

*Primary Examiner* — Asok K Sarkar
*Assistant Examiner* — Dmitriy Yemelyanov
(74) *Attorney, Agent, or Firm* — Harness, Dickey & Pierce PLC

(57) ABSTRACT

A semiconductor device includes storage electrodes on a substrate and one or more supporters configured to couple one or more portions of the storage electrodes. The semiconductor device may include multiple non-intersecting supporters extending in parallel to a surface of the substrate. At least one supporter may have an upper surface that is substantially coplanar with upper surfaces of the storage electrodes. The storage electrodes may include a capacitor dielectric layer that conformally covers one or more surfaces of the storage electrodes and one or more supporters. A storage electrode may include upper and lower storage electrodes coupled together. The upper and lower storage electrodes may have different horizontal widths.

20 Claims, 40 Drawing Sheets

SEMICONDUCTOR DEVICE HAVING SUPPORTERS AND METHOD OF MANUFACTURING THE SAME

CROSS-REFERENCE TO RELATED APPLICATION

This application claims priority under 35 U.S.C. § 119 to Korean Patent Application No. 10-2015-0129053 filed on Sep. 11, 2015, the disclosure of which is hereby incorporated by reference in its entirety.

BACKGROUND

Technical Field

The inventive concepts relate to a semiconductor device having supporters and a method of manufacturing the same.

Description of Related Art

As semiconductor devices have become highly integrated, a design rule thereof have become smaller continuously. Accordingly, an area occupied by a unit cell including one transistor and one capacitor has become smaller gradually. Thus, in some cases it may be difficult to secure a capacitance due to the decrease of the area occupied by the unit cell.

SUMMARY

Some example embodiments of the inventive concepts provide semiconductor devices that are configured to provide improved capacitance.

Some example embodiments of the inventive concepts provide semiconductor devices that include storage nodes having a high aspect ratio. The semiconductor devices may be configured to prevent bending or collapse of the storage nodes.

Example embodiments of the inventive concepts provide methods of manufacturing the semiconductor devices.

The technical objectives of the inventive concepts are not limited to the above disclosure, and other objectives may become apparent to those of ordinary skill in the art based on the following descriptions.

According to some example embodiments, a semiconductor device may include a plurality of via structures on a substrate, a plurality of storage electrodes on separate ones of the via structures, a first supporter configured to connect first portions of the storage electrodes, a second supporter configured to connect second portions of the storage electrodes, and a third supporter configured to connect third portions of the storage electrodes, the third supporter having an upper surface. Each of the storage electrodes may include a first portion, a second portion on the first portion, a third portion on the second portion, and an upper surface. The upper surface of the third supporter may be substantially coplanar with the upper surfaces of the storage electrodes.

In some example embodiments, the first supporter and the second supporter may be spaced apart according to a first spacing distance, the second supporter and the third supporter may be spaced apart according to a second spacing distance, and the second spacing distance may be smaller than the first spacing distance.

In some example embodiments, the third supporter may be thicker than the second supporter in a vertical direction.

In some example embodiments, each of the storage electrodes may include at least one sidewall, and each of the first supporter, the second supporter, and the third supporter may include separate, respective side surfaces, each of the side surfaces being in direct contact at least one sidewall of at least one of the storage electrodes.

In some example embodiments, each of the storage electrodes may include a lower storage electrode configured to extend from an upper surface of at least one of the via structures to a level that is coplanar with an upper surface of the second supporter, and an upper storage electrode configured to extend from an upper surface of the lower storage electrode to a level that is coplanar with the upper surface of the third supporter.

In some example embodiments, the upper storage electrode may be narrower than the lower storage electrode in a horizontal direction.

In some example embodiments, the semiconductor device may include a capacitor dielectric layer, a lower plate electrode on the capacitor dielectric layer, and an upper plate electrode on the lower plate electrode. The capacitor dielectric layer may be configured to conformally cover an upper surface of the first supporter, a lower surface of the first supporter, an upper surface of the second supporter, a lower surface of the second supporter, an upper surface of the third supporter, a lower surface of the third supporter, at least one upper surface of the storage electrodes, and at least one sidewall of the storage electrodes.

In some example embodiments, the lower plate electrode may include a first portion configured to fill a space at least partially defined by the lower surface of the first supporter and at least one sidewall of the storage electrodes, a second portion configured to fill a space at least partially defined by the upper surface of the first supporter, the lower surface of the second supporter, and at least one sidewall of the storage electrodes, and a third portion configured to fill a space at least partially defined by the upper surface of the second supporter, the lower surface of the third supporter, and at least one sidewall of the storage electrodes, and a fourth portion configured to cover the upper surface of the third supporter and the upper surfaces of the storage electrodes.

In some example embodiments, the third portion of the lower plate electrode is narrower in a vertical direction than the second portion of the lower plate electrode.

In some example embodiments, at least one of the storage electrodes may have at least one of a pillar shape and a cylindrical shape.

According to some example embodiments, a semiconductor device may include a plurality of via structures on a substrate, a plurality of storage electrodes on the via structures a first supporter configured to connect first portions of the storage electrodes, a second supporter configured to connect second portions of the storage electrodes, a third supporter configured to connect third portions of the storage electrodes, and a capacitor dielectric layer. Each of the storage electrodes may include a first portion, a second portion on the first portion, a third portion on the second portion, an upper surface, and at least one sidewall. The capacitor dielectric layer may be configured to conformally cover an upper surface of the first supporter, a lower surface of the first supporter, an upper surface of the second supporter, a lower surface of the second supporter, an upper surface of the third supporter, a lower surface of the third supporter, at least one upper surface of the storage electrodes, and at least one sidewall of the storage electrodes. The first support, the second support, and the third support may be in direct contact with at least one sidewall of at least one of the storage electrodes. A portion of the capacitor dielectric layer may conformally cover both the upper surface of the third supporter and the upper surfaces of the storage electrodes has a planar profile.

In some example embodiments, the third portion may be narrower than the second portion in a horizontal direction.

In some example embodiments, the semiconductor device may further include an upper plate electrode on the lower plate electrode and a capacitor capping insulating layer on the upper plate electrode.

In some example embodiments, the lower plate electrode may include titanium nitride (TiN), and the upper plate electrode may include at least one of silicon germanium (SiGe) and tungsten (W).

In some example embodiments, the semiconductor device may further include at least one bit line structure between at least two via structures of the plurality of via structures on the substrate, a pad isolation region between the via structures and the bit line structures, and an etch stop layer configured to cover upper surfaces of the via structures and upper surfaces of the pad isolation regions. The storage electrodes may pass through the etch stop layer and are in contact with the upper surfaces of the via structures.

According to some example embodiments, a semiconductor device may include a plurality of storage electrodes on a substrate, each of the storage electrodes extending substantially orthogonal to a surface of the substrate, each of the storage electrodes including an upper surface that is a substrate-distal surface, and at least one supporter extending substantially parallel to the surface of the substrate, the at least one supporter configured to couple each of the storage electrodes.

In some example embodiments, the at least one supporter may have an upper surface that is substantially coplanar with the upper surfaces of the storage electrodes.

In some example embodiments, the semiconductor device may include a plurality of non-intersecting supporters extending substantially parallel to the surface of the substrate, each of the supporters being configured to couple each of the storage electrodes.

In some example embodiments, each of the storage electrodes may include a lower storage electrode and an upper storage electrode, the lower storage electrode and the upper storage electrode being coupled together at coupled portions, the coupled portions of the upper storage electrode and the lower storage electrode having different thicknesses in a horizontal direction.

In some example embodiments, the coupled portion of the upper storage electrode may be narrower than the coupled portion of the lower storage electrode in a horizontal direction.

Details of some example embodiments are included in the detailed description and drawings.

BRIEF DESCRIPTION OF THE DRAWINGS

The foregoing and other features and advantages of the inventive concepts will be apparent from the more particular description of some example embodiments of the inventive concepts, as illustrated in the accompanying drawings in which like reference numerals denote the same respective parts throughout the different views. These drawings are not, however, to scale and may not precisely reflect the precise structural or performance characteristics of any given embodiment, and should not be interpreted as defining or limiting the range of values or properties encompassed by example embodiments. In the drawings.

DETAILED DESCRIPTION OF EXAMPLE EMBODIMENTS

Figure 1A:
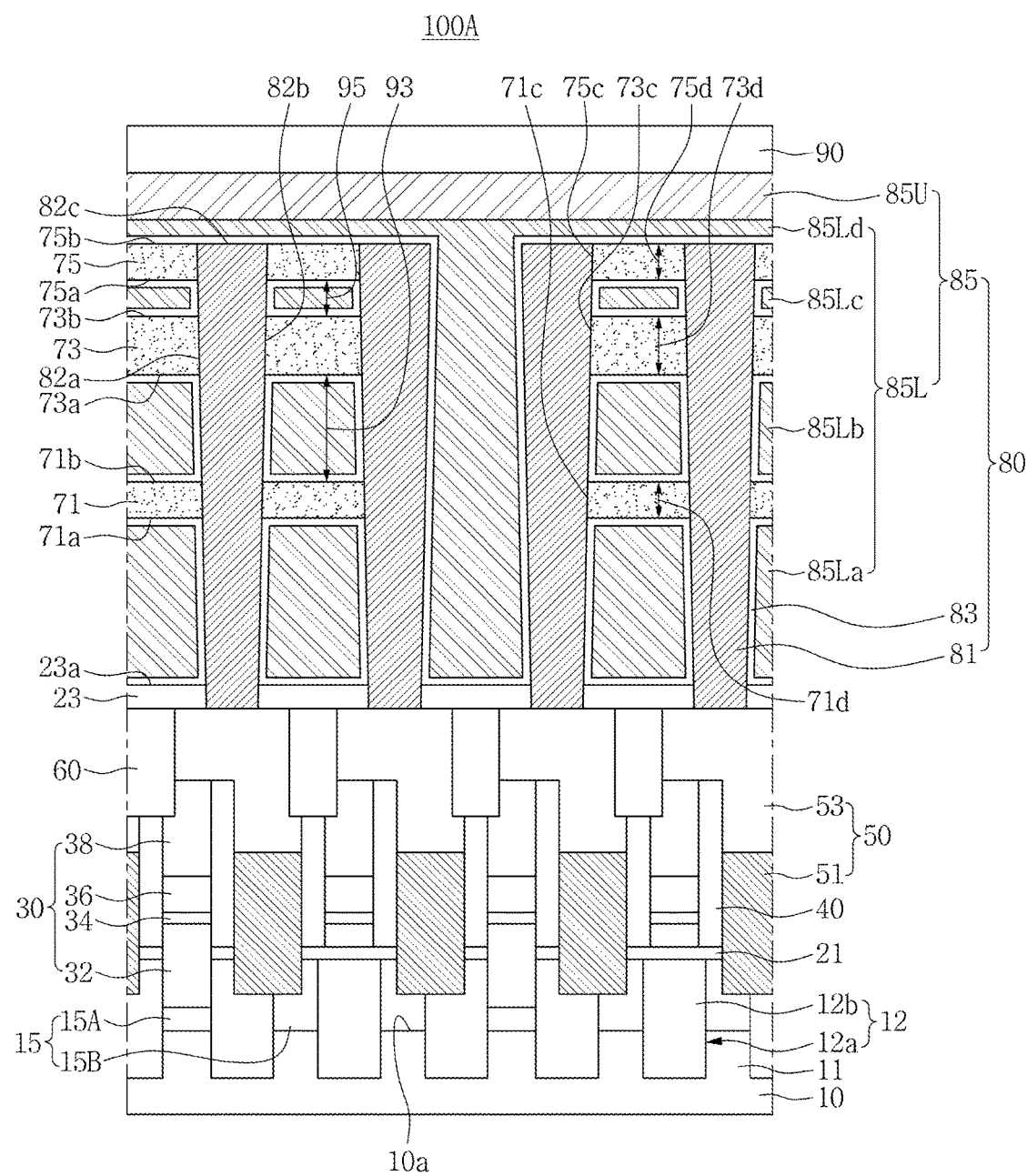
FIG. 1A, FIG. 1B, and FIG. 1C are longitudinal cross-sectional views for describing semiconductor devices according to various example embodiments of the inventive concepts.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1A is a longitudinal cross-sectional view for describing a semiconductor device in accordance with some example embodiments of the inventive concepts.

Referring to FIG. 1A, a semiconductor device 100A in accordance with some example embodiments of the inventive concepts may include a substrate 10, device isolation regions 12 formed in the substrate 10 and defining active regions 11, source/drain areas 15, bit line structures 30, bit line spacers 40, via structures 50, a first supporter 71, a second supporter 73, a third supporter 75, and capacitor structures 80. The semiconductor device 100A may further include pad isolation regions 60 which electrically separate the via structures 50. The semiconductor device 100A may further include an interlayer insulating layer 21, an etch stop layer 23, and a capacitor capping insulating layer 90.

In some example embodiments, including the example embodiment illustrated in FIG. 1A, one or more of the storage electrodes 81 may extend substantially orthogonal to a surface 10a of the substrate 10. As shown in FIG. 1A, one or more of the storage electrodes 81 may have an upper surface 82c that is a substrate-distal surface, relative to the respective storage electrode 81.

In some example embodiments, including the example embodiment illustrated in FIG. 1A, one or more of the supporters 71, 73, 75 may extend substantially parallel to the surface 10a of the substrate 10. As shown in FIG. 1A, the supporters 71, 73, 75 may extend along non-intersecting parallel planes such that the supporters 71, 73, 75 are non-intersecting and extend in parallel.

The substrate 10 may include a single crystalline semiconductor substrate such as a silicon wafer or a silicon-on-insulator (SOI) wafer.

The device isolation region 12 may include a device isolation trench 12a formed in the substrate 10, and a device isolation insulating material 12b filled in the device isolation trench 12a. The device isolation insulating material 12b may include silicon oxide (SiO2).

The active regions 11 may include portions vertically overlapping the bit line structures 30 and portions vertically overlapping the via structures 50. The active regions 11 may protrude from the substrate 10.

The source/drain areas 15 may include first source/drain areas 15A and second source/drain areas 15B. For example, the first source/drain areas 15A may be formed in a part of the active regions 11. The second source/drain areas 15B may be formed in another part of the active regions 11. The first source/drain areas 15A may be in contact with the bit line structures 30, and the second source/drain areas 15B may be in contact with the via structures 50.

In an example embodiment, the semiconductor device 100A may include gate structures intersecting the active regions 11 and extending onto the device isolation region 12. The gate structures may be buried in the substrate 10. The gate structures may include gate insulating patterns, gate electrode patterns, and gate capping patterns. The gate electrode patterns may be word lines of a memory device such as a dynamic random access memory (DRAM) and so on.

The bit line structures 30 may include bit line contact patterns 32, bit line barrier patterns 34, bit line electrode patterns 36, and bit line capping patterns 38.

The bit line contact patterns 32 may be in partial contact with the first source/drain areas 15A. Lower surfaces of the bit line contact patterns 32 in contact with the first source/drain areas 15A may be located at lower levels than lower surfaces of the bit line contact patterns 32 not in contact with the first source/drain areas 15A. The bit line contact patterns 32 may include polysilicon.

The bit line barrier patterns 34 may be formed on the bit line contact patterns 32. The bit line barrier patterns 34 may include a metal or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi).

The bit line electrode patterns 36 may be formed on the bit line barrier patterns 34. The bit line electrode patterns 36 may include a metal such as tungsten (W) or copper (Cu).

The bit line capping patterns 38 may be formed on the bit line electrode patterns 36. The bit line capping pattern 38 may be partially recessed by the pad isolation regions 60. The bit line capping patterns 38 may include silicon nitride.

Sidewalls of the bit line contact patterns 32, sidewalls of the bit line barrier patterns 34, sidewalls of the bit line electrode patterns 36, and sidewalls of the bit line capping patterns 38 may be vertically aligned.

The bit line spacers 40 may be conformally formed on sidewalls of the bit line structures 30. The bit line spacers 40 may be a single layer or multilayer. The bit line spacers 40 may include at least one of silicon nitride (SiN), silicon oxide (SiO2), and a combination thereof. Upper surfaces of the bit line spacers 40 may be substantially coplanar with upper surfaces of the bit line structures 30.

The via structures 50 may electrically connect the second source/drain areas 15B to the capacitor structures 80. The via structures 50 may include via plugs 51 and via pads 53.

The via plugs 51 may be in direct contact with the second source/drain areas 15B. For example, the via plugs 51 may include polysilicon. The via plugs 51 may be located between the bit line structures 30.

The via pads 53 may be formed on the via plugs 51. In an example embodiment, the via pads 53 may include via barrier patterns and via electrode patterns. The via barrier patterns may include at least one of titanium nitride (TiN), tantalum nitride (TaN), and another metal nitride. The via electrode patterns may include a metal such as tungsten (W) or copper (Cu).

The via pads 53 may include lower via pads located between the bit line structures 30 and upper via pads located at higher levels than the upper surfaces of the bit line structures 30. Horizontal widths of the upper via pads may be greater than horizontal widths of the lower via pads. The upper via pads may partially cover the upper surfaces of the bit line structures 30.

In an example embodiment, the via structures 50 may further include silicide patterns between the via plugs 51 and the via pads 53. The silicide patterns may include titanium silicide (TiSi), tungsten silicide (WSi), nickel silicide (NiSi), cobalt silicide (CoSi), or another metal silicide.

The pad isolation regions 60 may be formed to partially pass through boundaries between sidewalls of the bit line structures 30 and the via pads 53. Upper surfaces of the pad isolation regions 60 and upper surfaces of the via pads 53 may be substantially coplanar. The via pads 53 may be electrically separated by the pad isolation regions 60.

The capacitor structures 80 may include storage electrodes 81, a capacitor dielectric layer 83, and a plate electrode 85.

The storage electrodes 81 may be electrically connected to the via structures 50. For example, the storage electrodes 81 may be in direct contact with the via pads 53 of the via structures 50. The storage electrodes 81 may have a pillar shape. The storage electrodes 81 may include a metal or a metal compound. For example, the storage electrodes 81 may include titanium nitride (TiN).

The capacitor dielectric layer 83 may be conformally formed on a part of surfaces of the storage electrode 81, a part of surfaces of the first supporter 71, a part of surfaces of the second supporter 73, a part of surfaces of the third supporter 75, and an upper surface of the etch stop layer 23. For example, the capacitor dielectric layer 83 may be conformally formed on the upper surface 23a of the etch stop layer 23, a lower surface 71a of the first supporter 71, and sidewalls 82a, 82b of the storage electrodes 81. Further, the capacitor dielectric layer 83 may be conformally formed on an upper surface 71b of the first supporter 71, a lower surface 73a of the second supporter 73, and sidewalls 82a, 82b of the storage electrodes 81. Further, the capacitor dielectric layer 83 may be conformally formed on an upper surface 73b of the second supporter 73, a lower surface 75a of the third supporter 75, and sidewalls 82a, 82b of the storage electrodes 81. Further, the capacitor dielectric layer 83 may be conformally formed on an upper surface 75b of the third supporter 75, and sidewalls 82a, 82b of the storage electrodes 81. The capacitor dielectric layer 83 may not be formed between the first supporter 71 and the storage electrodes 81, between the second supporter 73 and the storage electrodes 81, and between the third supporter 75 and the storage electrodes 81.

The capacitor dielectric layer 83 may include at least one of a metal oxide, such as hafnium oxide (HfxOy), aluminum oxide (AlxOy), titanium oxide (TixOy), tantalum oxide (TaxOy), ruthenium oxide (RuxOy), or lanthanum oxide (LaxOy), silicon oxide, and silicon nitride.

The plate electrode 85 may include a lower plate electrode 85L and an upper plate electrode 85U.

The lower plate electrode 85L may include a first portion 85La, a second portion 85Lb, a third portion 85Lc, and a fourth portion 85Ld.

The first portion 85La of the lower plate electrode 85L may fill a space defined by the upper surface 23a of the etch stop layer 23, the lower surface 71a of the first supporter 71, and the sidewalls 82a, 82b of the storage electrodes 81.

The second portion 85Lb of the lower plate electrode 85L may fill a space defined by the upper surface 71b of the first supporter 71, the lower surface 73a of the second supporter 73, and the sidewalls 82a, 82b of the storage electrodes 81.

The third portion 85Lc of the lower plate electrode 85L may fill a space defined by the upper surface 73b of the second supporter 73, the lower surface 75a of the third supporter 75, and the sidewalls 82a, 82b of the storage electrodes 81.

The fourth portion 85Ld of the lower plate electrode 85L may be formed on the upper surface of the third supporter 75, and the upper surfaces of the storage electrodes 81. The fourth portion 85Ld of the lower plate electrode 85L may extend between the storage electrodes 81 on which the first supporter 71, the second supporter 73, and the third supporter 75 are not disposed.

The first portion 85La, the second portion 85Lb, and the third portion 85Lc of the lower plate electrode 85L may be surrounded by the capacitor dielectric layer 83. The fourth portion 85Ld of the lower plate electrode 85L may be disposed on the capacitor dielectric layer 83. The lower plate electrode 85L may include titanium nitride (TiN).

The upper plate electrode 85U may be disposed on the fourth portion 85Ld of the lower plate electrode 85L. The upper plate electrode 85U may be a single layer or multilayer. For example, the upper plate electrode 85U may include at least one of silicon germanium (SiGe), tungsten (W), and a combination thereof.

The first supporter 71 may be disposed between the first portion 85La and the second portion 85Lb of the lower plate electrode 85L. A side surface 71c of the first supporter 71 may be in direct contact with the sidewalls 82a, 82b of the storage electrodes 81. The first supporter 71 may include at least one of silicon nitride (SiN), silicon carbonitride (SiCN), and silicon oxynitride (SiON).

The second supporter 73 may be disposed between the second portion 85Lb and the third portion 85Lc of the lower plate electrode 85L. A side surface 73c of the second supporter 73 may be in direct contact with the sidewalls 82a, 82b of the storage electrodes 81. The second supporter 73 may be a single layer or multilayer. The second supporter 73 may include at least one of silicon nitride (SiN), silicon carbonitride (SiCN), silicon oxynitride (SiON), and a combination thereof.

The third supporter 75 may be disposed between the third portion 85Lc and the fourth portion 85Ld of the lower plate electrode 85L. A side surface 75c of the third supporter 75 may be in direct contact with the sidewalls 82a, 82b of the storage electrodes 81. The third supporter 75 may be substantially coplanar with the upper surfaces 82c of the storage electrodes 81. The third supporter 75 may include at least one of silicon nitride (SiN), silicon carbonitride (SiCN), and silicon oxynitride (SiON).

A spacing distance 95 from the upper surface 73b of the second supporter 73 to the lower surface 75a of the third supporter 75 may be smaller than a spacing distance 93 from the upper surface 71b of the first supporter 71 to the lower surface 73a of the second supporter 73. The spacing distance 93 may be referred to herein as a first spacing distance. The spacing distance 95 may be referred to herein as a second spacing distance. In some example embodiments, the first and second spacing distances may be different. For example, the second spacing distance may be smaller than the first spacing distance. A thickness 75d of the third supporter 75 in a vertical direction ("vertical thickness") may be smaller than a vertical thickness 73d of the second supporter 73. Further, a vertical thickness 71d of the first supporter 71 may be smaller than the vertical thickness 73d of the second supporter 73.

The interlayer insulating layer 21 may be formed on the device isolation region 12 and the source/drain areas 15. The interlayer insulating layer 21 may be a single layer or multilayer. The interlayer insulating layer 21 may include at least one of silicon nitride (SiN), silicon oxide (SiO2), and a combination thereof. The bit line structures 30 and the via plugs 51 may partially pass through the interlayer insulating layer 21.

The etch stop layer 23 may be formed on the pad isolation regions 60 and upper surfaces of the via structures 50. The storage electrodes 81 may partially pass through the etch stop layer 23. The etch stop layer 23 may include silicon nitride (SiN).

The capacitor capping insulating layer 90 may be formed on the upper plate electrode 85U. The capacitor capping insulating layer 90 may include silicon oxide or silicon nitride.

In some example embodiments, semiconductor device 100A may include a limited selection of supporters 71, 73, 75. In some example embodiments, semiconductor device 100A may include at least one of supporters 71, 73, 75. For example, a semiconductor device 100A may include supporter 75 and may omit supporters 71 and 73. In another example, a semiconductor device 100A may include supporter 73 and may omit supporters 71 and 75.

Figure 1B:
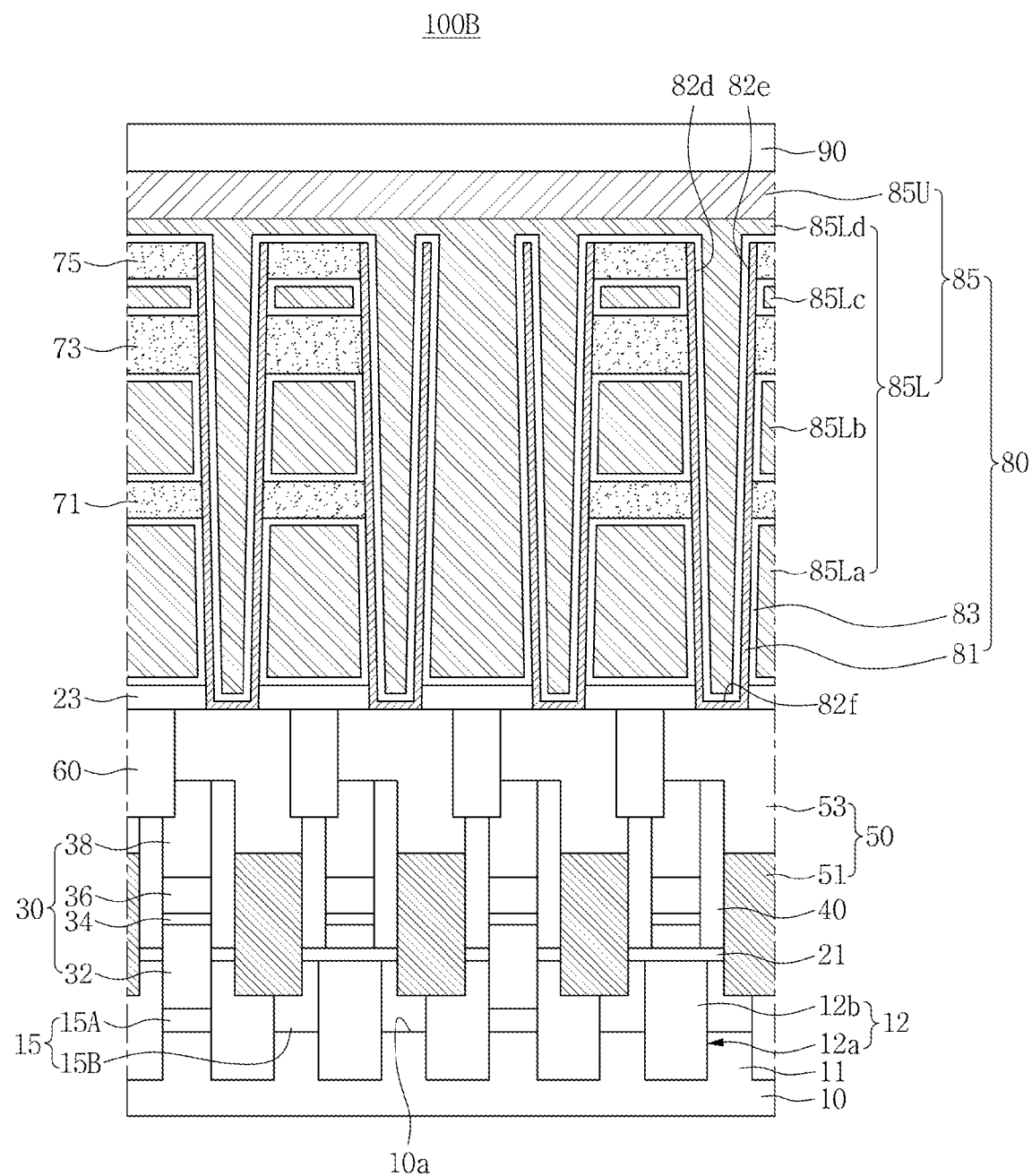

FIG. 1B is a longitudinal cross-sectional view for describing a semiconductor device in accordance with some example embodiments of the inventive concepts. In some example embodiments of the inventive concepts, detailed descriptions of the same content as those of the above-described embodiments will be omitted.

Referring to FIG. 1B, in a semiconductor device 100B according to some example embodiments of the inventive concepts, capacitor structures 80 may include storage electrodes 81 having cylindrical shapes, where inner sidewalls 82d, 82e and inner bottom surfaces 82f of the storage devices define interior spaces of the storage electrodes. A capacitor dielectric layer 83 may conformally cover inner bottom surfaces 82f and inner sidewalls 82d, 82e of the storage electrodes 81. A fourth portion 85Ld of a lower plate electrode 85L may fill an interior space defined of the storage electrodes 81.

Figure 1C:
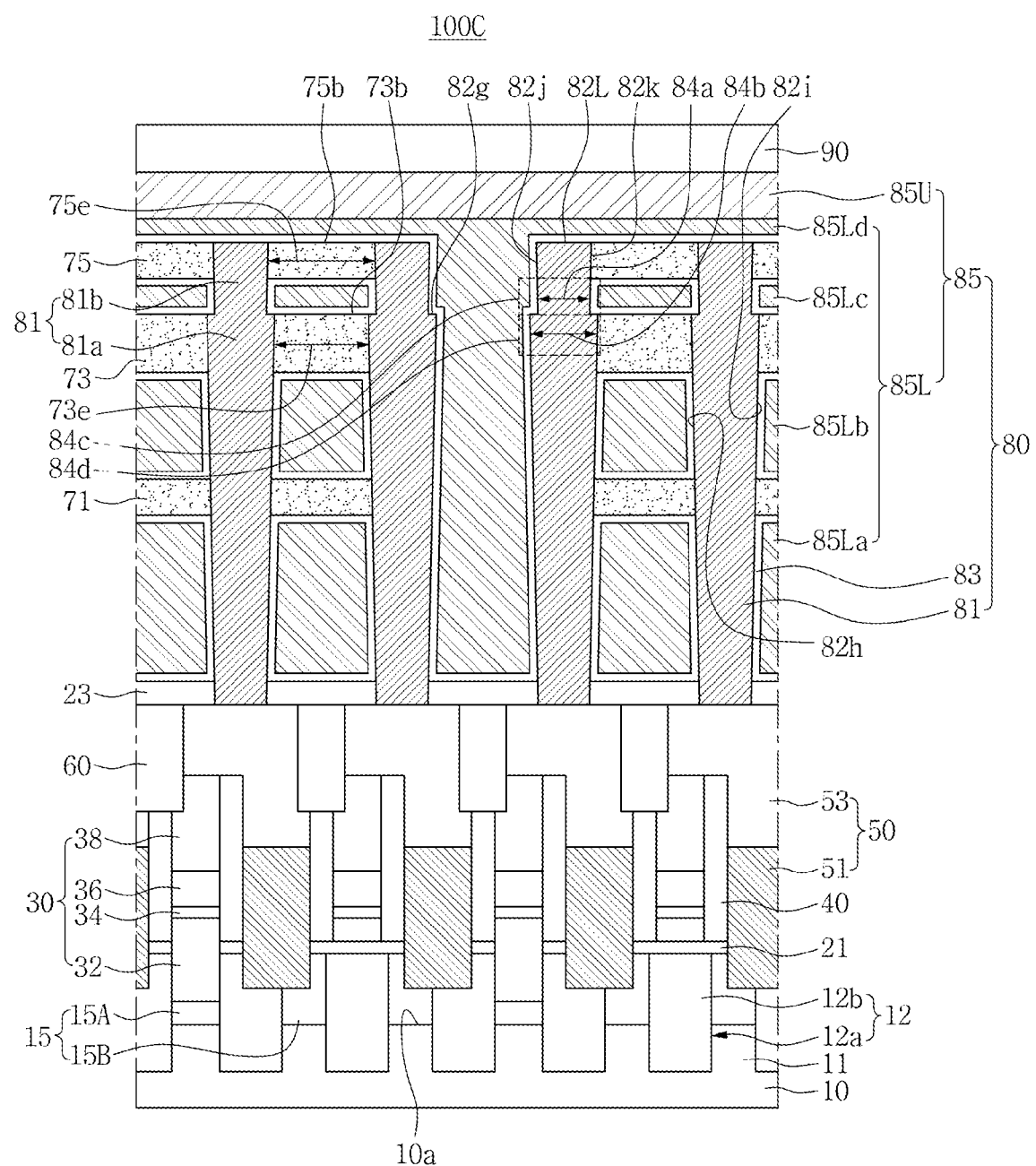

FIG. 1C is a longitudinal cross-sectional view for describing a semiconductor device in accordance with some example embodiments of the inventive concepts. In some embodiments of the inventive concepts, detailed descriptions of the same content as those of the above-described example embodiments will be omitted.

Referring to FIG. 1C, in a semiconductor device 100C according to some example embodiments of the inventive concepts, capacitor structures 80 may include storage electrodes 81 having lower storage electrodes 81a that extend from upper surfaces of via pads 53 to a level of an upper surface 73b of a second supporter 73 and upper storage electrodes 81b that extend from upper surfaces 82g of the lower storage electrodes 81a to a level of an upper surface 75b of a third supporter 75. As shown in FIG. 1C, an upper storage electrode 81b and a lower storage electrode 81a in a given storage electrode 81 are coupled together at respective coupled portions 84c, 84d.

Sidewalls 82h, 82i of the lower storage electrodes 81a may be in direct contact with side surfaces 71c of the first supporter 71 and side surfaces 73c of the second supporter 73. Sidewalls 82j, 82k of the upper storage electrodes 81b may be in direct contact with side surfaces 75c of the third supporter 75.

Upper surfaces 82g of the lower storage electrodes 81a may be substantially coplanar with the upper surface 73b of the second supporter 73. Upper surfaces 82l of the upper storage electrodes 81b may be substantially coplanar with the upper surface 75b of the third supporter 75. In some example embodiments, the coupled portions 84c, 84d of a respective upper storage electrode 81b and lower storage electrode 81a may have different thicknesses in a horizontal direction ("horizontal widths"). In the example embodiment illustrated in FIG. 1C, for example, a thickness 84a in the horizontal direction ("horizontal width") of the coupled portion 84c of upper storage electrodes 81b may be smaller than horizontal widths 84b of the coupled portion 84d of the lower storage electrodes 81a. In an example embodiment, a horizontal width 75e of the third supporter 75 may be greater than a horizontal width 73e of the second supporter 73.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, and FIG. 2M are longitudinal cross-sectional views illustrating a method of manufacturing a semiconductor device in accordance with some example embodiments of the inventive concepts some example embodiments.

Figure 2A:
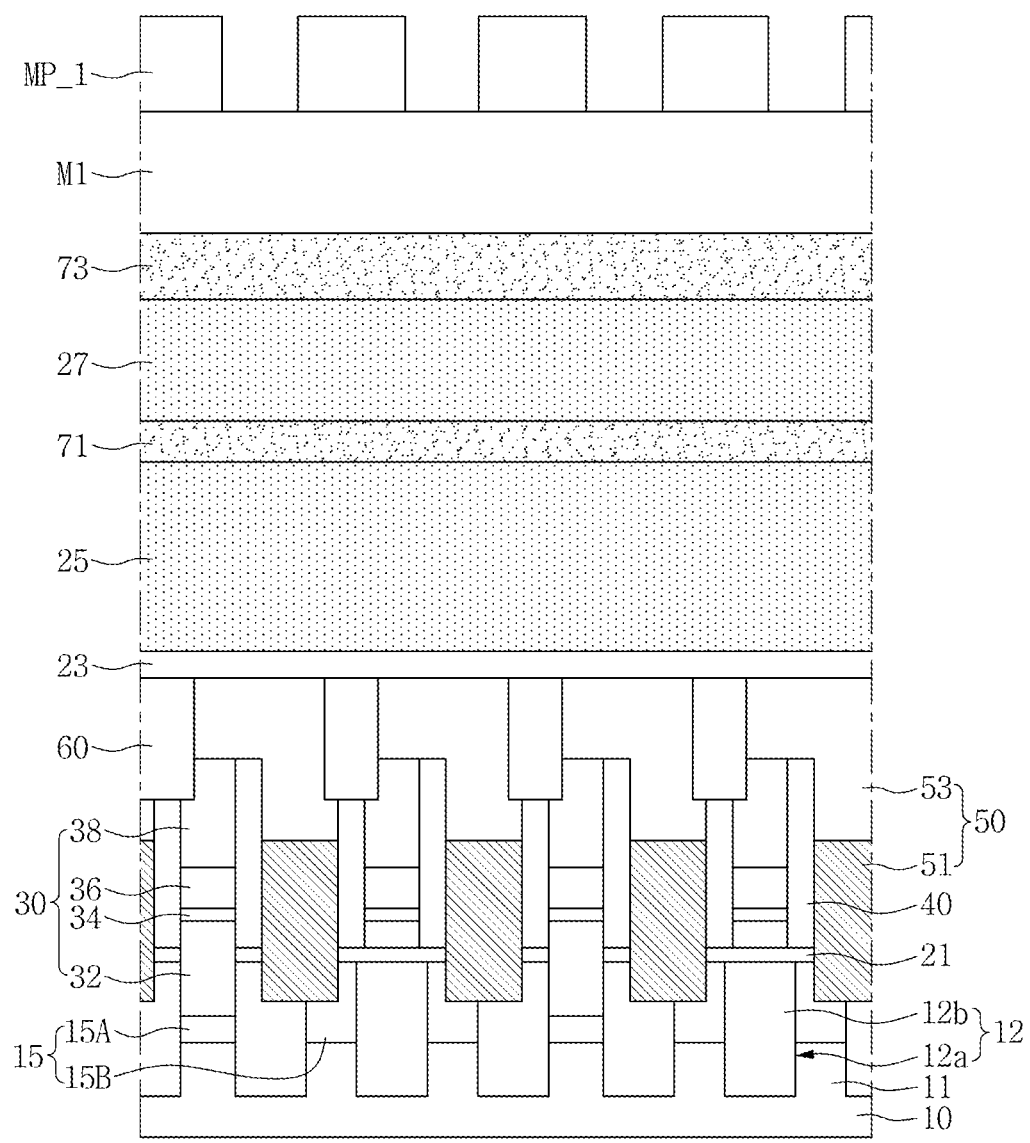
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, and FIG. 2M are longitudinal cross-sectional views illustrating a method of manufacturing a semiconductor device in accordance with some example embodiments of the inventive concepts.

Referring to FIG. 2A, the method of manufacturing the semiconductor device in accordance with some example embodiments of the inventive concepts may include preparing a substrate 10, forming device isolation regions 12 defining active regions 11 in the substrate 10, forming source/drain areas 15 in the substrate 10, forming an interlayer insulating layer 21 on the substrate 10, forming bit line structures 30 on the substrate 10, forming via structures 50 between the bit line structures 30 on the substrate 10, forming an etch stop layer 23 covering the via structures 50, and sequentially forming a lower molding layer 25, a first supporter 71, an upper molding layer 27, a second supporter 73, a first hard mask layer M1, and a first mask pattern MP_1. In some example embodiments, the method may further include forming gate structures intersecting the active regions 11 and extending onto the device isolation regions 12. Further, in some example embodiments, the method may be further include forming bit line spacers 40 on sidewalls of the bit line structures 30.

The substrate 10 may include a single crystalline semiconductor substrate such as a silicon wafer or SOI wafer.

The forming of the device isolation regions 12 may include performing a shallow trench isolation (STI) process. The STI process may include forming a device isolation trench 12a in the substrate 10 and filling the device isolation trench 12a with a device isolation insulating material 12b. The device isolation insulating material 12b may include silicon oxide (SiO2).

The forming of the gate structures may include forming gate trenches intersecting the active regions 11 and extending onto the device isolation region 12, forming gate insulating patterns on surfaces of the active regions 11 exposed by the gate trenches, forming gate electrode patterns on the gate insulating patterns and the device isolation region 12 exposed by the gate trenches to partially fill the gate trenches, and forming gate capping patterns on the gate electrode patterns 24 to fully fill the gate trenches. The gate insulating patterns may include at least one of silicon oxide, silicon nitride, silicon oxynitride, and a metal oxide. The metal oxide may include at least one of hafnium oxide (HfxOy), aluminum oxide (AlxOy), zirconium oxide (ZrxOy), lanthanum oxide (LaxOy), and titanium oxide (TixOy). The gate electrode patterns may include at least one of titanium nitride (TiN), tantalum nitride (TaN), tungsten (W), and copper (Cu). The gate capping patterns may include silicon nitride (SiN).

The forming of the source/drain areas 15 may include implanting impurity ions in the active regions 11 by an ion implantation process. The source/drain areas 15 may include first source/drain areas 15A and second source/drain areas 15B. For example, the first source/drain areas 15A may be in contact with the bit line structures 30, and the second source/drain areas 15B may be in contact with via structures 50.

The interlayer insulating layer 21 may be formed on the substrate 10 to cover the gate structures, the source/drain areas 15, and the device isolation regions 12 by performing a deposition process. The interlayer insulating layer 21 may include at least one of silicon oxide (SiO2), silicon nitride (SiN), and a combination thereof.

The forming of the bit line structures 30 may include forming recessed regions exposing surfaces of the first source/drain areas 15A by partially removing upper portions of the interlayer insulating layer 21, and the first source/drain areas 15A of the source/drain areas 15 by performing an etching process, forming an bit line contact layer on the interlayer insulating layer 21 to fill the recessed regions by performing a deposition process, sequentially forming an bit line barrier layer, a bit line electrode layer, and a bit line capping layer on the bit line contact layer by performing a deposition process, and forming bit line contact patterns 32, bit line barrier patterns 34, bit line electrode patterns 36, and bit line capping patterns 38 by patterning the bit line capping layer, the bit line electrode layer, the bit line barrier layer, and the bit line contact layer by performing an etching process.

A part of the bit line structures 30 may be in contact with the first source/drain areas 15A, and another part of the bit line structures 30 may be in contact with the interlayer insulating layer 21 without contacting the first source/drain areas 15A. The bit line contact patterns 32 may include polysilicon. The bit line barrier patterns 34 may include a metal or a metal compound such as titanium (Ti), titanium nitride (TiN), titanium silicide (TiSi), tantalum (Ta), tantalum nitride (TaN), tantalum silicide (TaSi), nickel silicide (NiSi), cobalt silicide (CoSi), tungsten nitride (WN), or tungsten silicide (WSi). The bit line electrode patterns 36 may include a metal such as tungsten (W) or copper (Cu). The bit line capping patterns 38 may include silicon nitride (SiN).

The forming of the bit line spacers 40 may include conformally forming a spacer material layer on upper surfaces and sidewalls of the bit line structures 30 and the surface of the interlayer insulating layer 21 by performing a deposition process, and removing the spacer material layer formed on the upper surfaces of the bit line structures 30 and the surface of the interlayer insulating layer 21 by performing an etching process. The spacer material layer may include at least one of silicon nitride (SiN), silicon oxide (SiO2), and a combination thereof.

In some example embodiment, the method may further include forming a sacrificial insulating layer filling between the bit line structures 30, after forming the bit line spacers 40.

The forming of the via structures 50 may include forming via holes that pass through the sacrificial layer filling between the bit line structures 30 and expose the second source/drain areas 15B, forming via plugs 51 that partially fill the via holes, and forming via pads 53 on the via plugs 51.

The forming of the via plugs 51 may include forming a via plug material layer on the substrate 10 to fill the via holes by performing a deposition process, and partially removing the via plug material layer by performing an etch-back process. The via plug material layer may include polysilicon.

The forming of the via pads 53 may include conformally forming a via barrier layer on upper surfaces of the via plugs 51, and sidewalls and upper surfaces of the bit line structures 30, forming a via electrode layer on the via barrier layer, and partially removing the via barrier layer and the via electrode layer and forming pad isolation regions 60. Upper surfaces of the via pads 53 and upper surfaces of the pad isolation regions 60 may be substantially coplanar. The via barrier layer may include at least one of titanium nitride (TiN), tantalum nitride (TaN), and another metal nitride. The via electrode layer may include a metal material such as tungsten (W) or copper (Cu).

In some example embodiment, the method may further include forming silicide patterns on the via plugs 51 by performing a silicide process. The silicide patterns may include titanium silicide (TiSi), tungsten silicide (WSi), nickel silicide (NiSi), cobalt silicide (CoSi), or another metal silicide.

The etch stop layer 23 may be entirely formed to cover the upper surfaces of the via pads 53 and the pad isolation regions 60. The etch stop layer 23 may include silicon nitride (SiN).

The lower molding layer 25 may be formed on the etch stop layer 23 by performing a deposition process. The lower molding layer 25 may include a material having an etch selectivity with respect to the etch stop layer 23. For example, the lower molding layer 25 may include silicon oxide (SiO2).

The first supporter 71 may be formed on the lower molding layer 25 by performing a deposition process. The first supporter 71 may include a material having an etch selectivity with respect to the lower molding layer 25. For example, the first supporter 71 may include at least one of silicon nitride (SiN), silicon carbonitride (SiCN), and silicon oxynitride (SiON).

The upper molding layer 27 may be formed on the first supporter 71 by performing a deposition process. The upper molding layer 27 may include a material having an etch selectivity with respect to the first supporter 71. For example, the upper molding layer 27 may include silicon oxide (SiO2).

The second supporter 73 may be formed on the upper molding layer 27 by performing a deposition process. The second supporter 73 may be formed in a single layer or multilayer. The second supporter 73 may include a material having an etch selectivity with respect to the upper molding layer 27. For example, the second supporter 73 may include at least one of silicon nitride (SiN), silicon carbonitride (SiCN), and silicon oxynitride (SiON).

The first hard mask layer M1 may be formed on the second supporter 73 by performing a deposition process. The first hard mask layer M1 may include a material having an etch selectivity with respect to the second supporter 73. The first hard mask layer M1 may include a photoresist, a polysilicon layer, an amorphous silicon layer, a silicon oxide layer, a spin-on-hardmask (SOH) layer, a silicon oxynitride layer, or an organic polymer layer. For example, the first hard mask layer M1 may include a polysilicon layer.

The forming of the first mask pattern MP_1 may include forming a material layer having an etch selectivity with respect to the first hard mask layer M1 on the first hard mask layer M1 by performing a deposition process, and patterning the material layer to selectively expose the first hard mask layer M1 by performing a photolithography process. For example, the first mask pattern MP_1 may include silicon oxide ($SiO_2$).

Figure 2B:
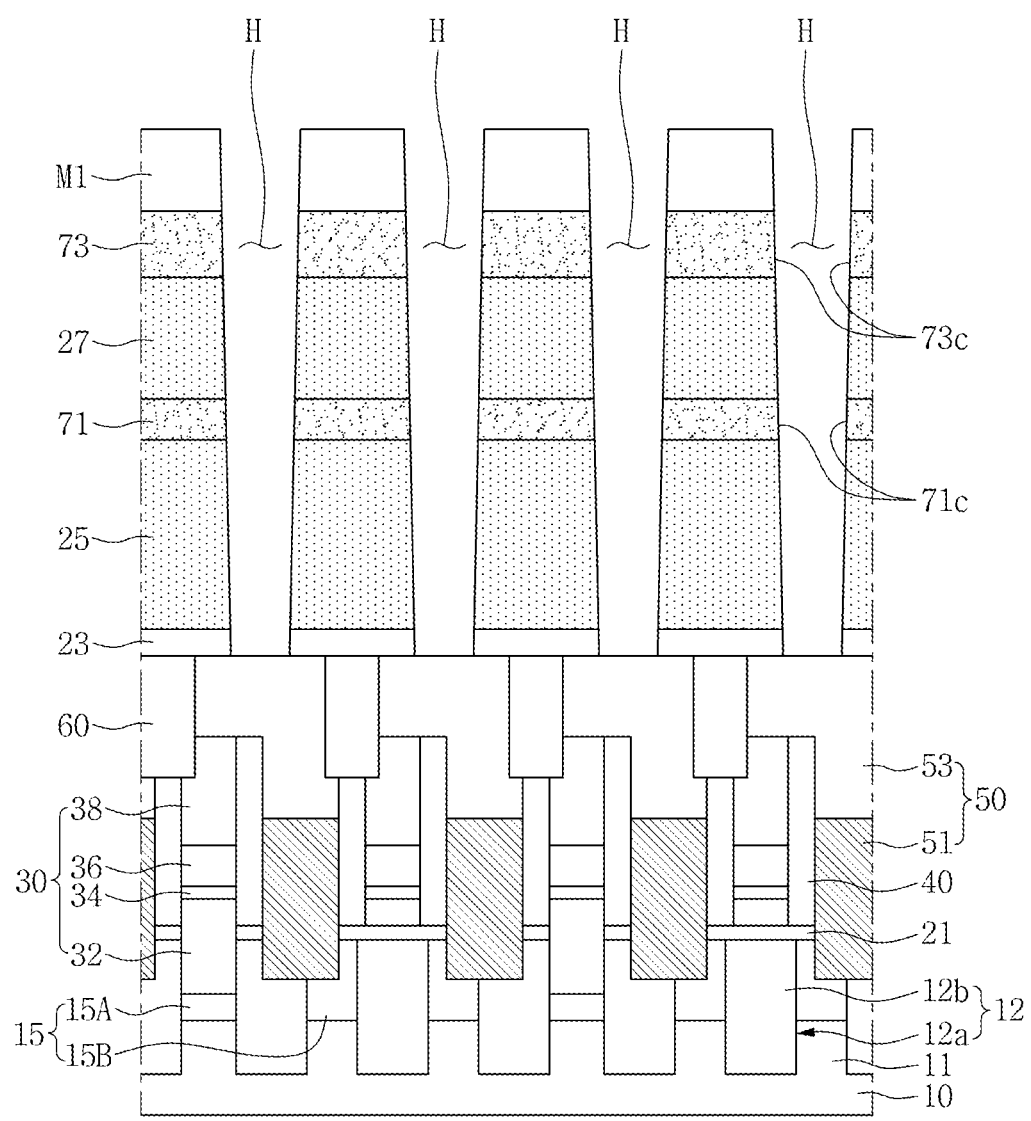

Referring to FIG. 2B, the method may include forming storage electrode holes H exposing the upper surfaces of the via pads 53 by patterning the first hard mask layer M1, the second supporter 73, the upper molding layer 27, the first supporter 71, the lower molding layer 25, and the etch stop layer 23 using the first mask pattern MP_1 (see FIG. 2A) as an etching mask. In this process, the first mask pattern MP_1 may be removed. Side surfaces 71c, 73c of the first supporter 71 and the second supporter 73 may be exposed in the storage electrode holes H.

In some example embodiment, the method may include uniformly making a level of an upper surface of the patterned first hard mask layer M1 by performing a partial etch-back process. At this time, the level of the upper surface of the first hard mask layer M1 may be lowered.

Figure 2C:
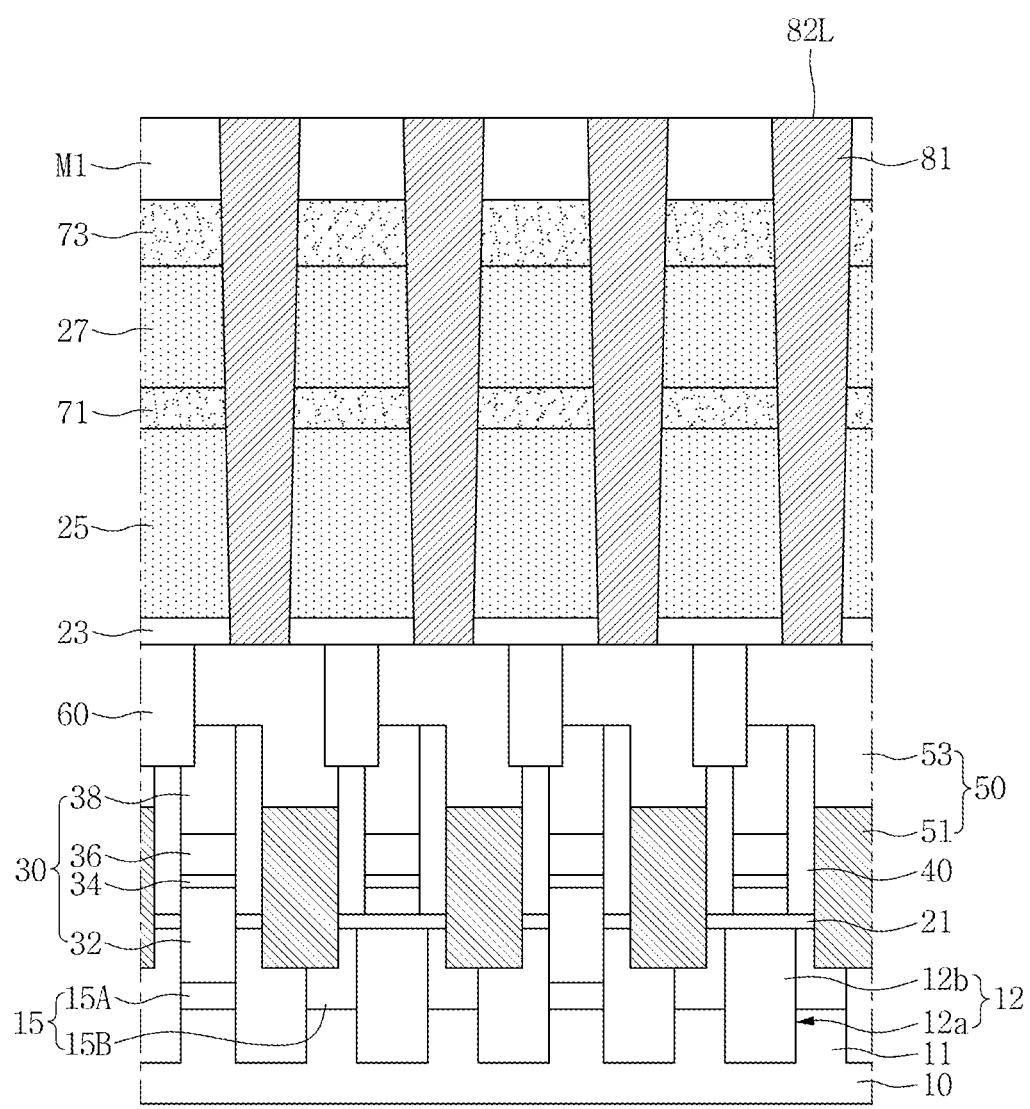

Referring to FIG. 2C, the method may include forming storage electrodes 81 filling the storage electrode holes H (see FIG. 2B). The forming of the storage electrodes 81 may include forming a storage electrode material layer that fills the storage electrode holes H and covers the first hard mask layer M1, and removing the storage electrode material layer by performing a planarization process until the upper surface of the first hard mask layer M1 is exposed. Accordingly, the upper surface of the first hard mask layer M1 and the upper surfaces 82c of the storage electrodes 81 may be coplanar. The storage electrodes 81 may include a metal or a metal nitride. For example, the storage electrodes 81 may include titanium nitride (TiN).

Figure 2D:
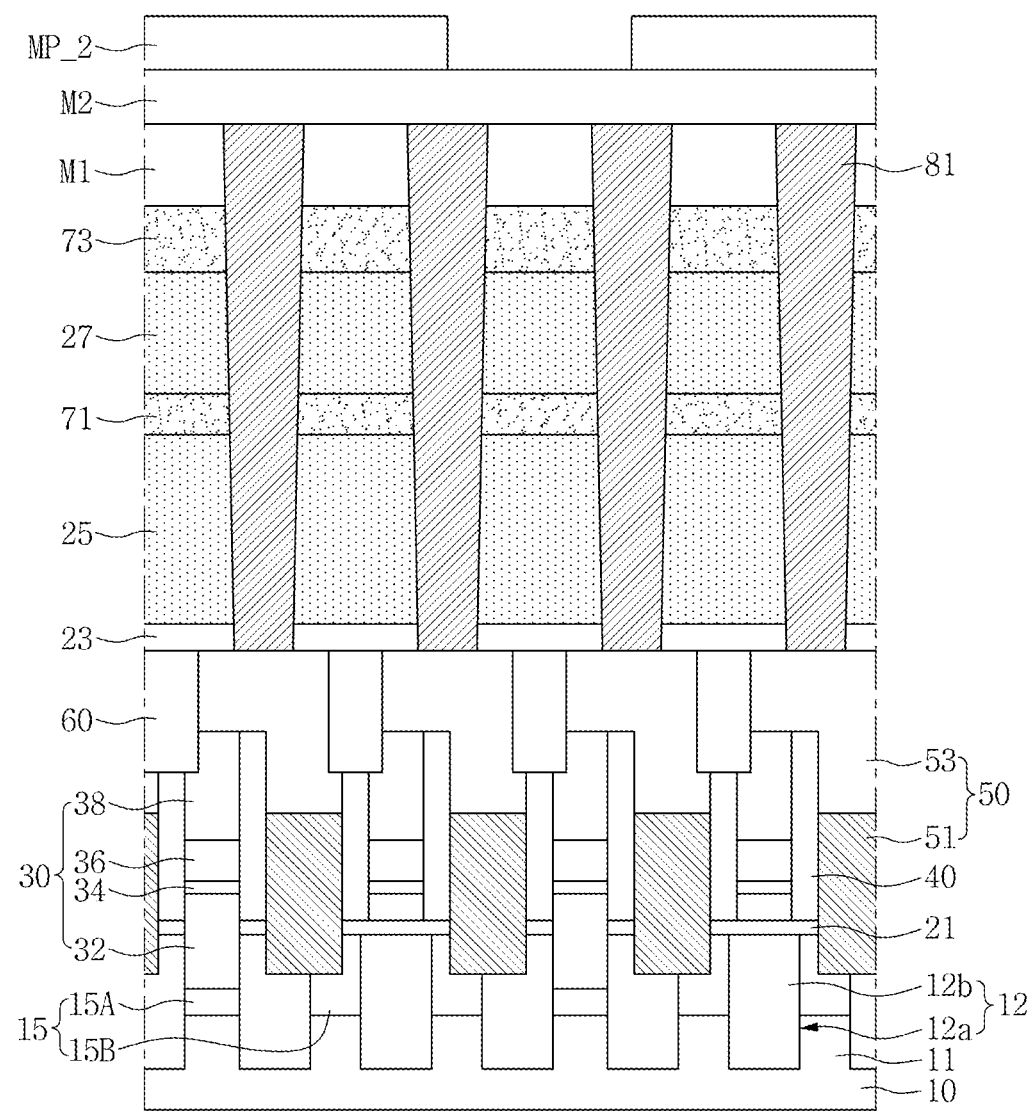

Referring to FIG. 2D, the method may include forming a second hard mask layer M2 covering the upper surface of the first hard mask layer M1 and the upper surfaces of the storage electrodes 81 by performing a deposition process, and forming a second mask pattern MP_2 selectively exposing the second hard mask layer M2 on the second hard mask layer M2. For example, the second hard mask layer M2 may include at least one of an amorphous carbon layer, an SOH, a silicon oxide layer, a silicon oxynitride layer, a silicon nitride layer, and a combination thereof. The second mask pattern MP_2 may include a photoresist.

Figure 2E:
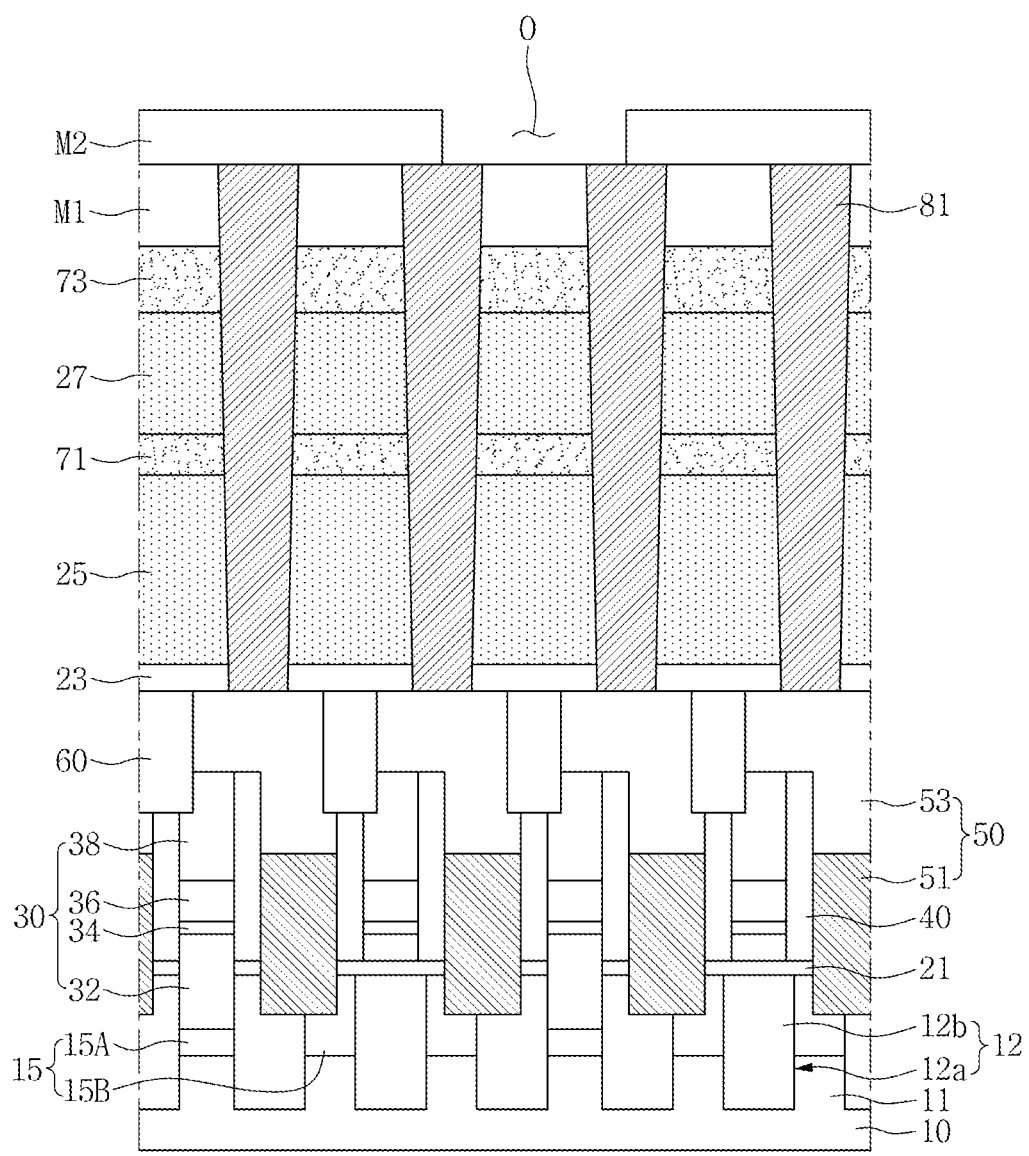

Referring to FIG. 2E, the method may include removing the second hard mask layer M2 exposed by the second mask pattern MP_2 by performing an etching process and forming an opening O exposing a part of the upper surface of the first hard mask layer M1 and a part of the upper surfaces of the storage electrodes 81.

Figure 2F:
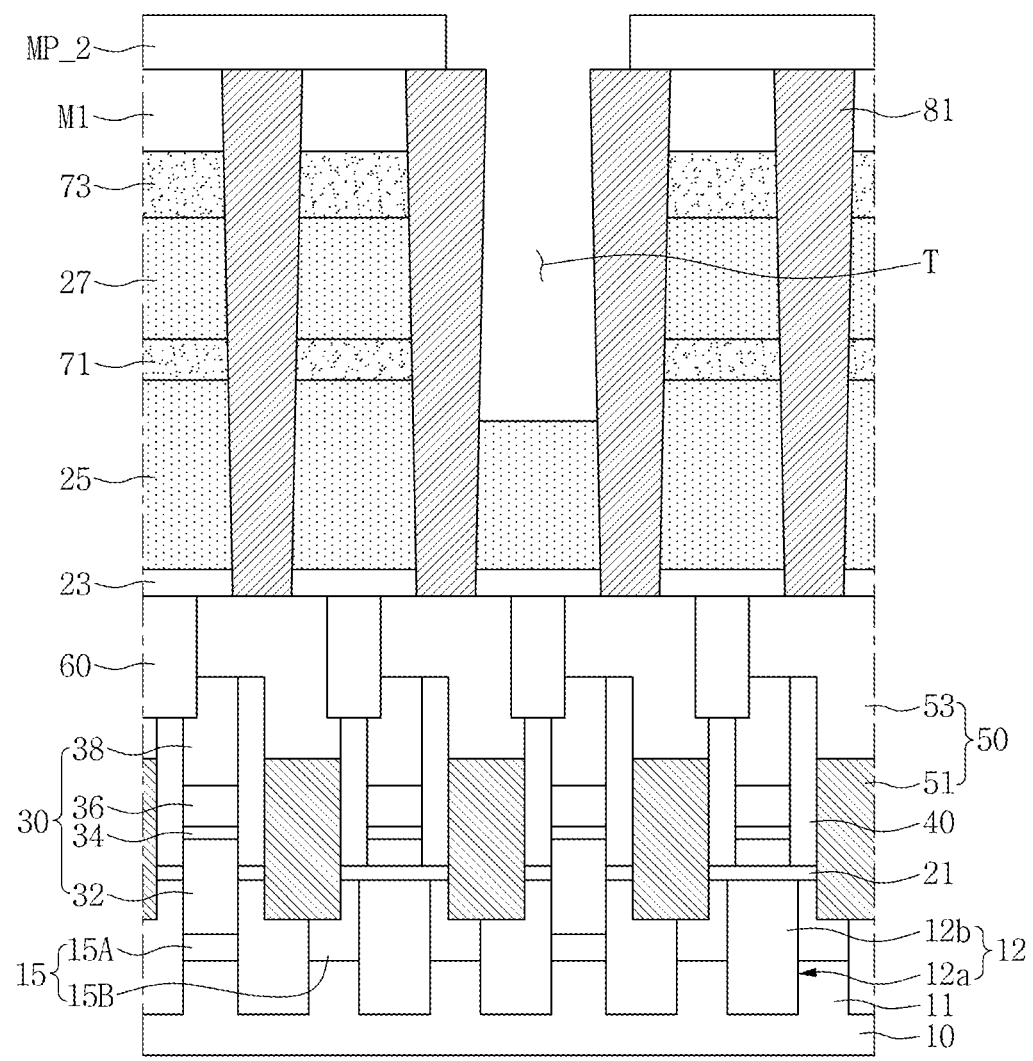

Referring to FIG. 2F, the method may include forming a trench T exposing the upper surface of the lower molding layer 25 by sequentially removing the first hard mask layer M1, the second supporter 73, the upper molding layer 27, the first supporter 71, and a part of the lower molding layer 25, which vertically overlap the opening O, by performing an etching process.

Figure 2G:
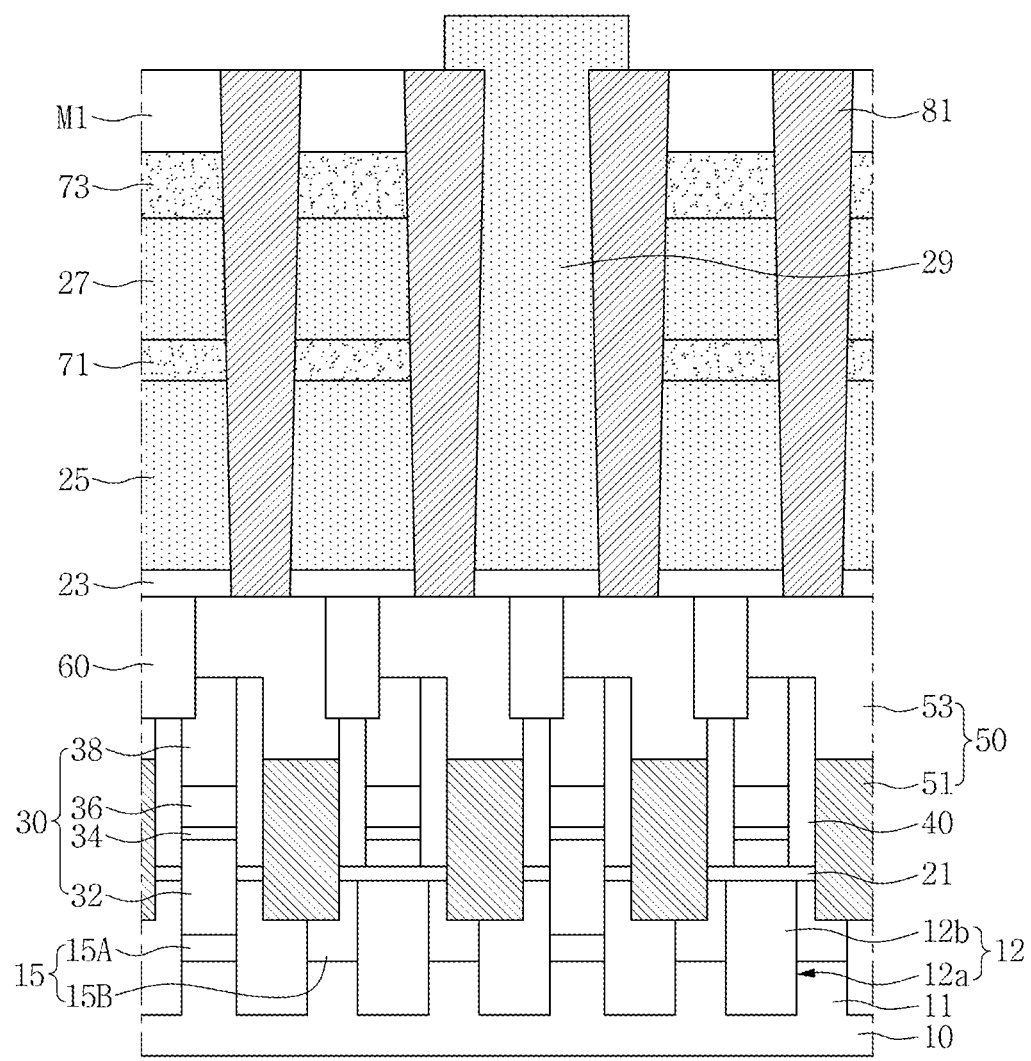

Referring to FIG. 2G, the method may include forming a trench capping layer 29 filling the trench T (see FIG. 2F), and removing the second hard mask layer M2 (see FIG. 2F) by performing an etching process. The forming of the trench capping layer 29 may include forming a trench capping material layer covering the upper surfaces of the second hard mask layer M2 and filling the trench T, and removing the trench capping material layer by performing a planarization process until the upper surfaces of the second hard mask layer M2 are exposed. A part of the trench capping layer 29 may protrude from the upper surface of the first hard mask layer M1 and the upper surfaces of the storage electrodes 81. In some example embodiment, the trench capping layer 29 may include the same material as the lower molding layer 25 and the upper molding layer 27. For example, the trench capping layer 29 may include silicon oxide.

Figure 2H:
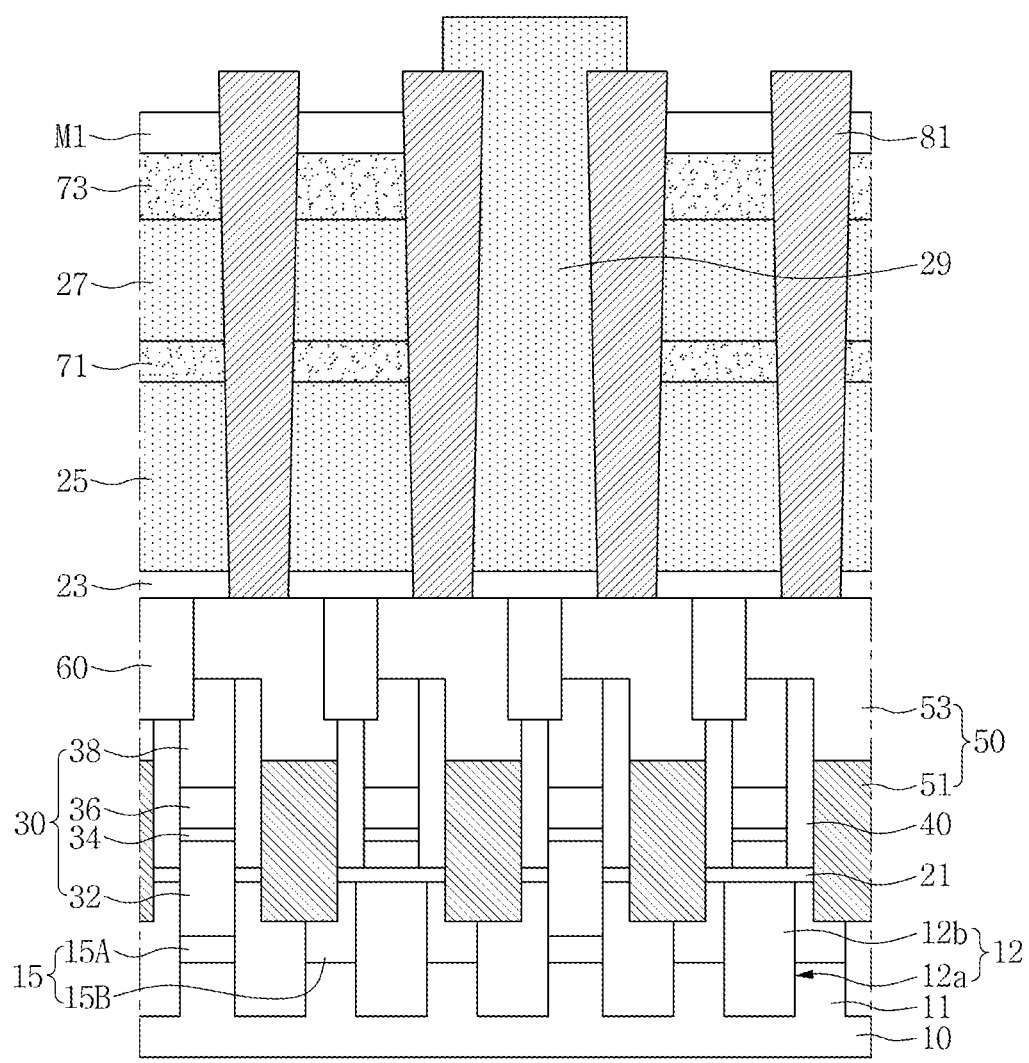

Referring to FIG. 2H, the method may include partially removing the first hard mask layer M1 by performing an etch-back process. In this process, an upper surface of the first hard mask layer M1 may be located at a lower level than the upper surfaces of the storage electrodes 81. Accordingly, upper portions of the storage electrodes 81 may protrude from the upper surface of the first hard mask layer M1.

Figure 2I:
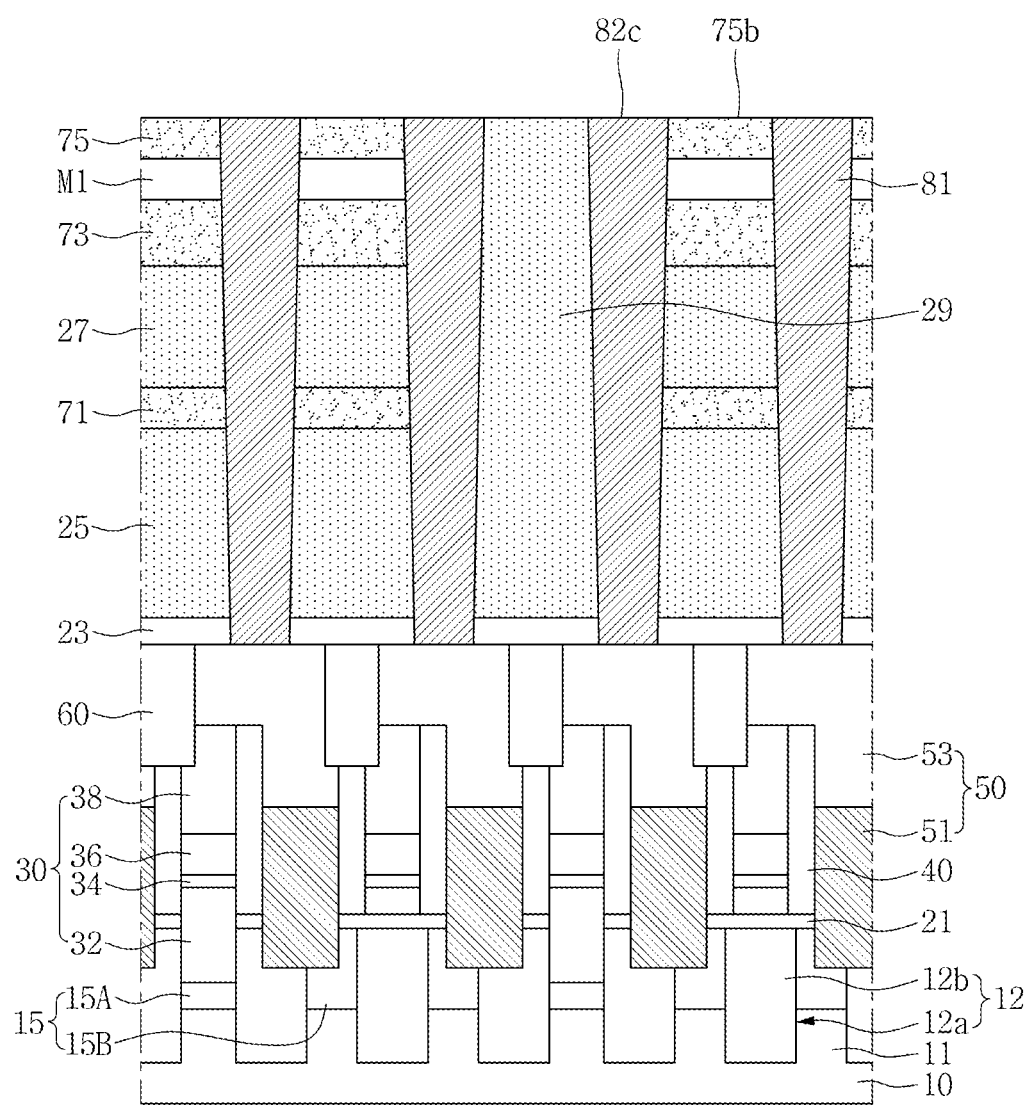

Referring to FIG. 2I, the method may include forming a third supporter 75 in a space defined by the upper surface of the first hard mask layer M1 and upper sidewalls of the storage electrodes 81. The forming of the third supporter 75 may include forming a third supporter material layer covering the upper surface of the first hard mask layer M1 and the upper sidewalls and the upper surfaces 82c of the storage electrodes 81 by performing a deposition process, and removing the third supporter material layer to expose the upper surfaces 82c of the storage electrodes 81 by performing a planarization process such as a chemical mechanical polishing (CMP) process. In this process, the trench capping layer 29 protruding from the upper surfaces 82c of the storage electrodes 81 may be removed. Accordingly, an upper surface 75b of the third supporter 75 and the upper surfaces 82c of the storage electrodes 81 may be coplanar. The third supporter 75 may include at least one of SiN, SiCN, SiON, and a combination thereof.

Figure 2J:
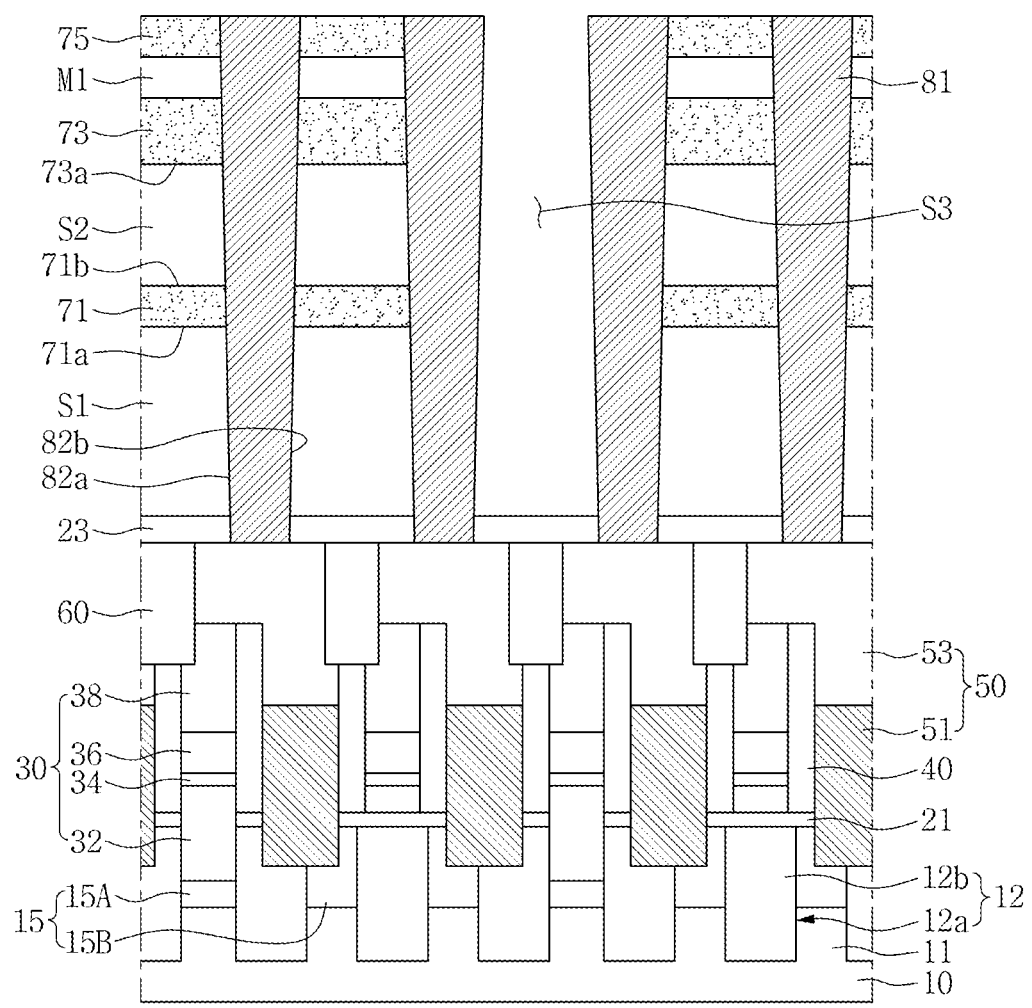

Referring to FIG. 2J, the method may include removing the lower molding layer 25, the upper molding layer 27, and the trench capping layer 29 by performing an etching process. As the lower molding layer 25 and the upper molding layer 27 are removed, first spaces S1 exposing the upper surface of the etch stop layer 23, the lower surface 71a of the first supporter 71, and a part of sidewalls 82a, 82b of the storage electrodes 81, and second spaces S2 exposing the upper surface 71b of the first supporter 71, the lower surface 73a of the second supporter 73, and a part of sidewalls 82a, 82b of the storage electrodes 81 may be formed. Further, as the trench capping layer 29 is removed, a third space S3 exposing all facing sidewalls 82a, 82b of adjacent storage electrodes 81 and the upper surface of the etch stop layer 23 may be formed. Upper end portion of the third space S3 may be open to an external environment.

Figure 2K:
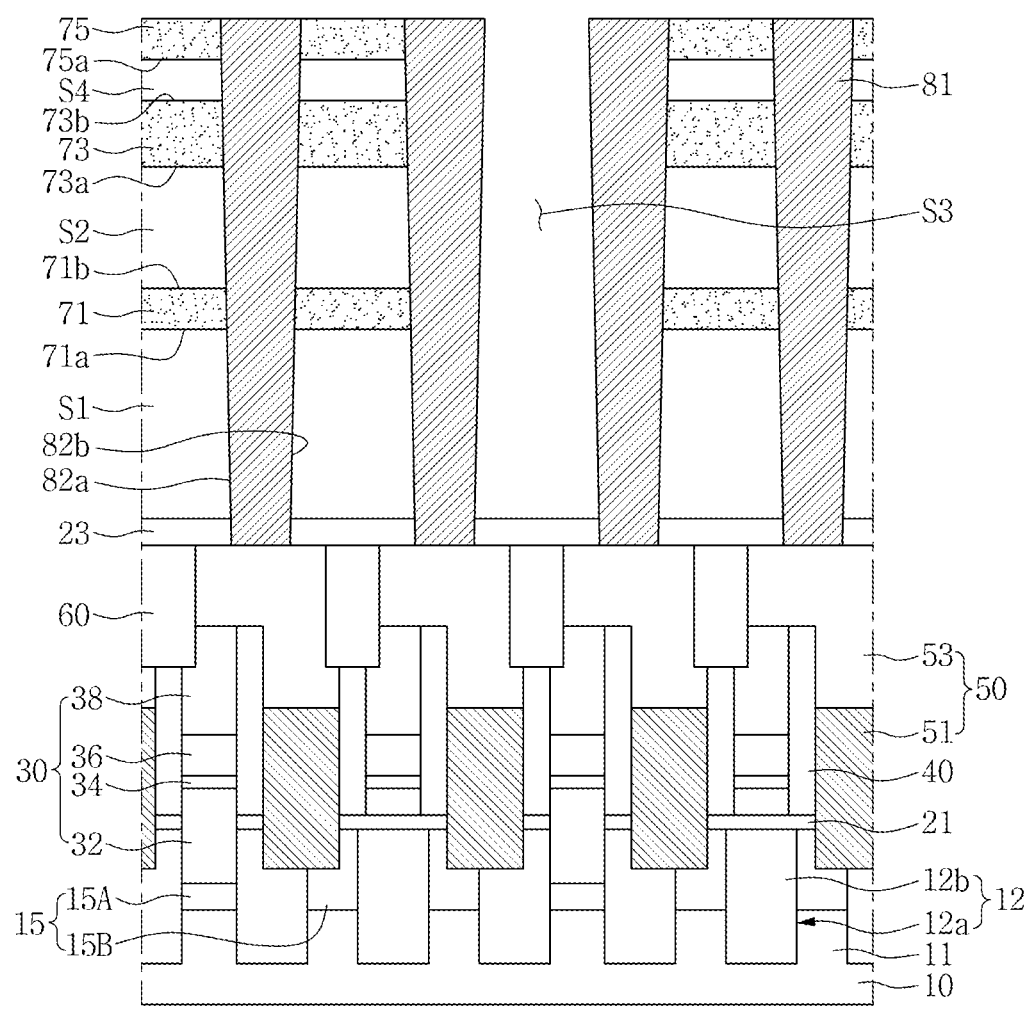

Referring to FIG. 2K, the method may include removing the first hard mask layer M1 by performing an etching process. As the first hard mask layer M1 is removed, fourth spaces S4 exposing the upper surface 73b of the second supporter 73, the lower surface 75a of the third supporter 75, and a part of the sidewalls 82a, 82b of the storage electrodes 81 may be formed.

Figure 2L:
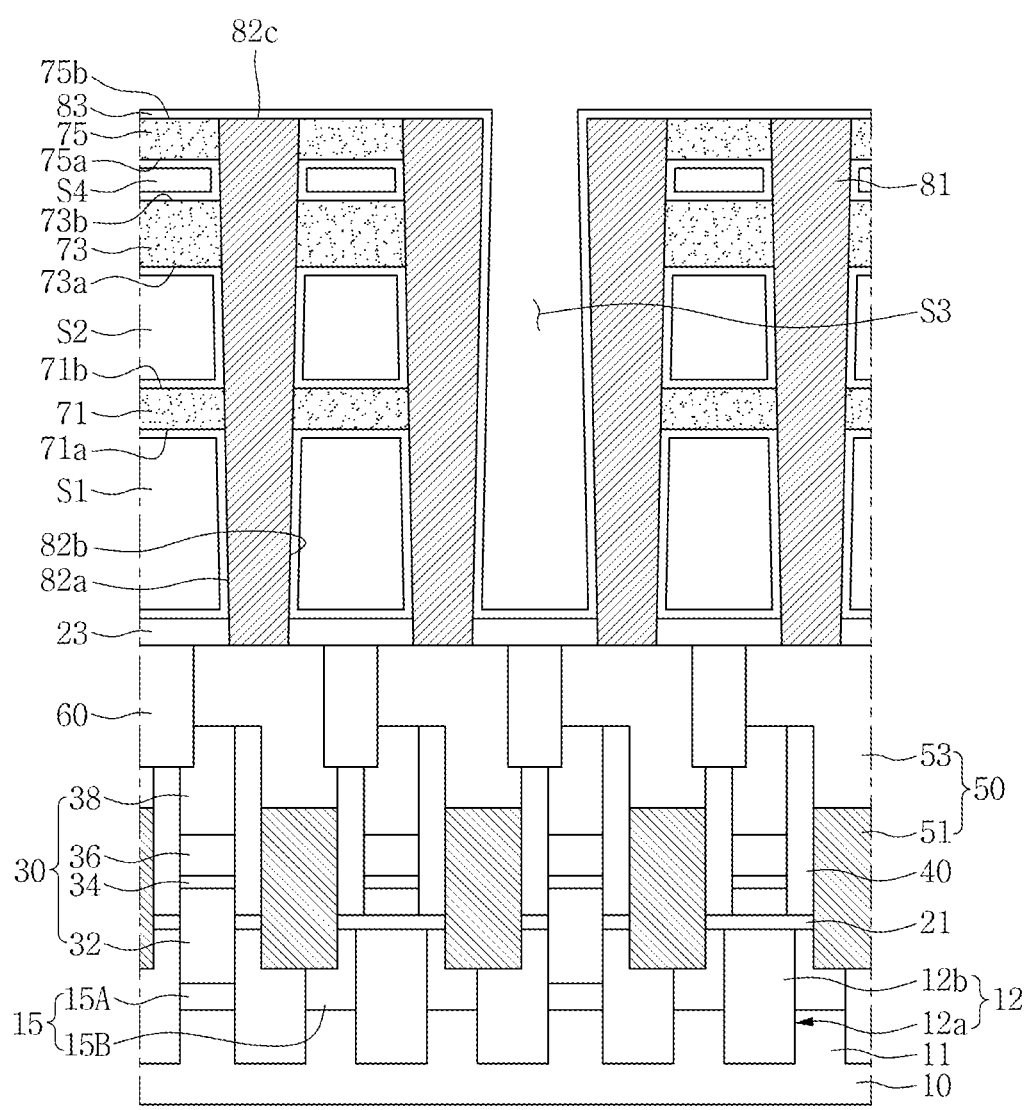

Referring to FIG. 2L, the method may include conformally forming a capacitor dielectric layer 83 on the upper surface of the etch stop layer 23, the upper surface 71b and the lower surface 71a of the first supporter 71, the upper surface 73b and the lower surface 73a of the second supporter 73, the upper surface 75b and the lower surface 75a of the third supporter 75, and the sidewalls 82a, 82b and the upper surfaces 82c of the storage electrodes 81 exposed in the first spaces S1, the second spaces S2, the third space S3, and the fourth spaces S4 by performing a deposition process. The capacitor dielectric layer 83 may include at least one of a metal oxide, such as hafnium oxide (HfxOy), aluminum oxide (AlxOy), titanium oxide (TixOy), tantalum oxide (TaxOy), ruthenium oxide (RuxOy), or lanthanum oxide (LaxOy), silicon oxide, and silicon nitride.

Figure 2M:
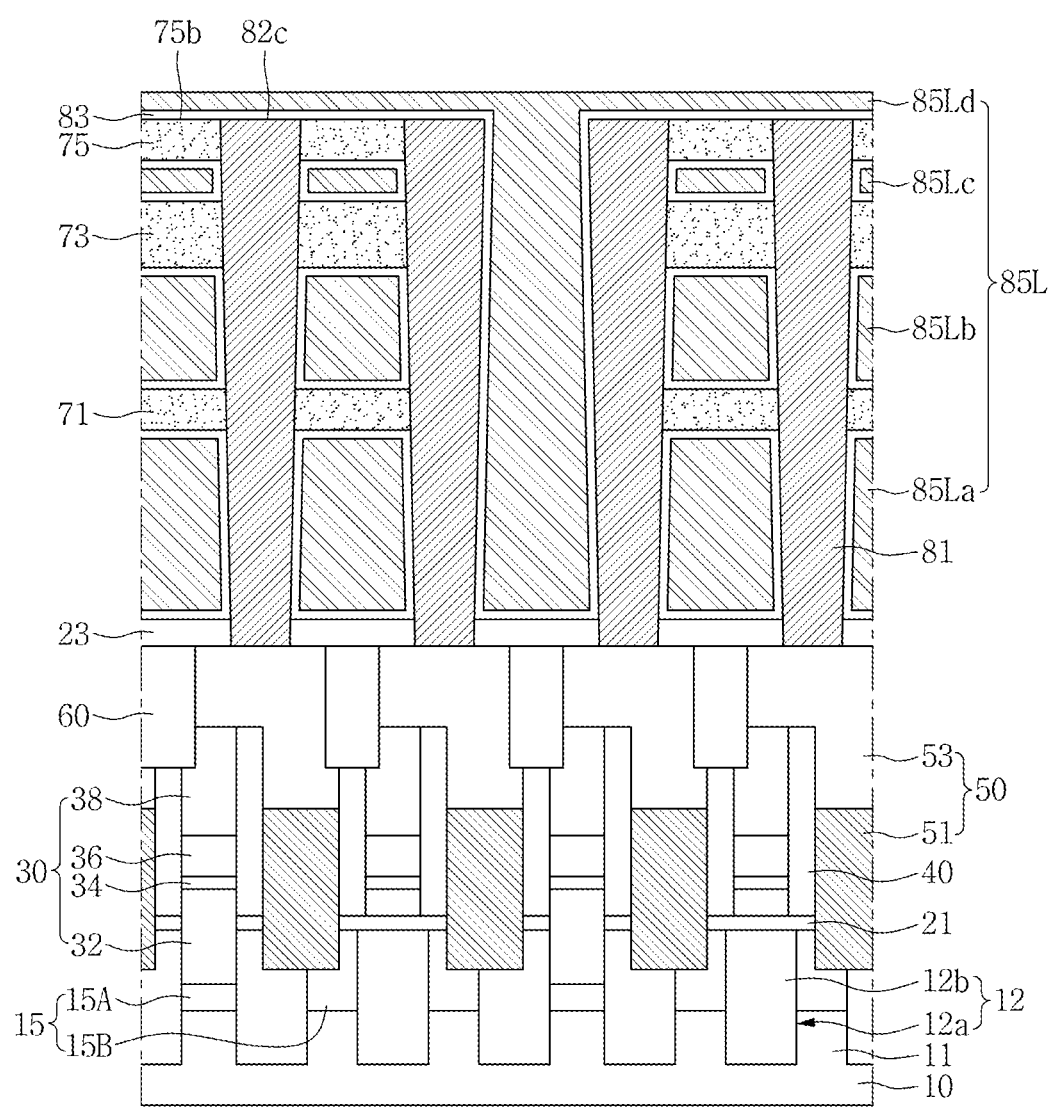

Referring to FIG. 2M, the method may include forming a lower plate electrode 85L on the capacitor dielectric layer 83 to fill the first spaces S1, the second spaces S2, the third space S3, and the fourth spaces S4.

The lower plate electrode 85L may include a first portion 85La, the second portions 85Lb, the third portion 85Lc, and the fourth portion 85Ld. The first portion 85La of the lower plate electrode 85L may fill the first spaces S1 (see FIG. 2L). The second portion 85Lb of the lower plate electrode 85L may fill the second spaces S2 (see FIG. 2L). The third portion 85Lc of the lower plate electrode 85L may fill the fourth spaces S4 (see FIG. 2L). The fourth portion 85Ld of the lower plate electrode 85L may cover the upper surface 75b of the third supporter 75 and the upper surfaces 82c of the storage electrodes 81. The fourth portion 85Ld of the lower plate electrode 85L may extend into the third spaces S3 (see FIG. 2L).

The first portion 85La, the second portion 85Lb, and the third portion 85Lc of the lower plate electrode 85L may be surrounded by the capacitor dielectric layer 83. Also, the fourth portion 85Ld of the lower plate electrode 85L may be disposed on the capacitor dielectric layer 83. The lower plate electrode 85L may include titanium nitride (TiN).

Referring again to FIG. 1A, the method may include forming an upper plate electrode 85U on the lower plate electrode 85L by performing a deposition process, and forming a capacitor capping insulating layer 90 covering the upper plate electrode 85U by performing a deposition process. The upper plate electrode 85U may be a single layer or multilayer. The upper plate electrode 85U may include at least one of silicon germanium (SiGe), tungsten (W), and a combination thereof. The capacitor capping insulating layer 90 may include silicon nitride (SiN).

Figure 3A:
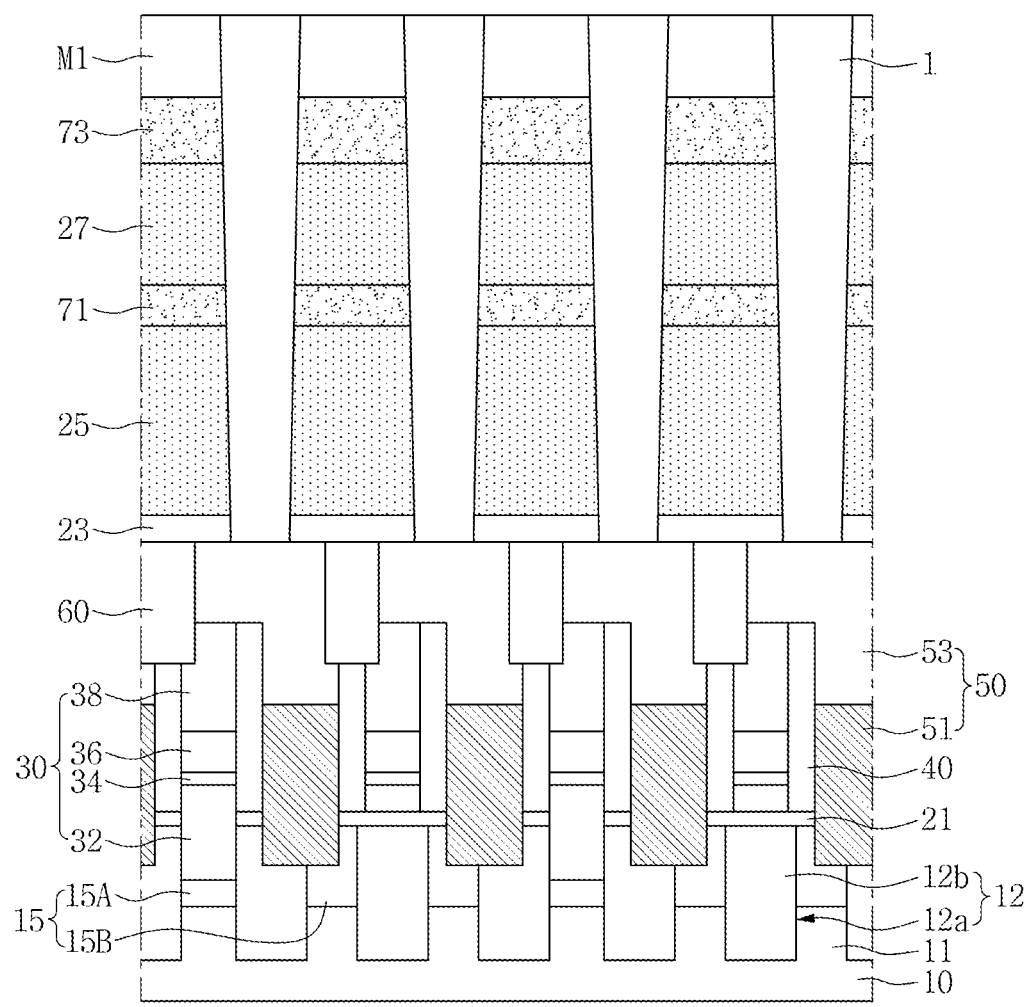
FIG. 3A and FIG. 3B are longitudinal cross-sectional views illustrating a method of manufacturing a semiconductor device in accordance with some example embodiments of the inventive concepts.
Figure 3B:
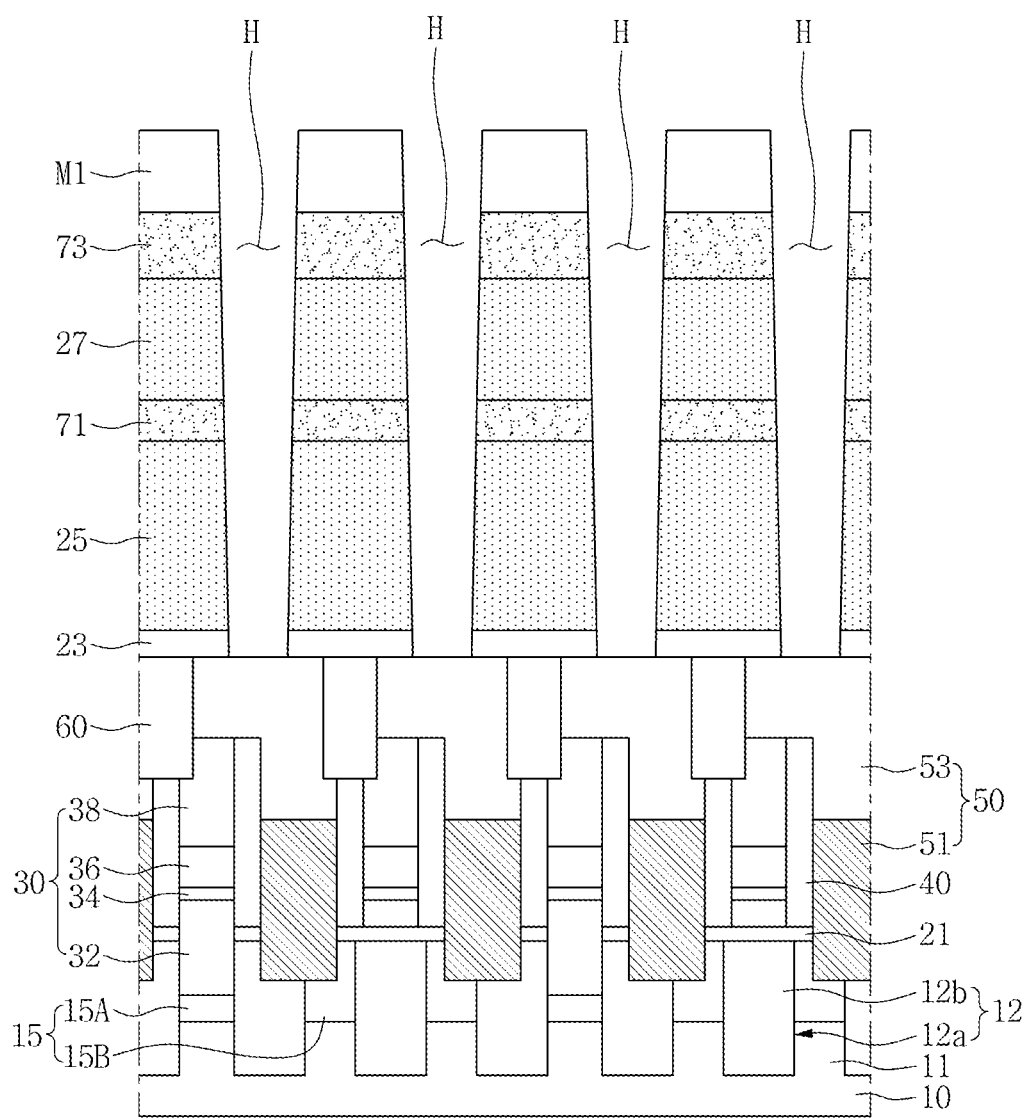

FIG. 3A and FIG. 3B are longitudinal cross-sectional views for describing a method of manufacturing a semiconductor device in accordance with some example embodiments of the inventive concepts. In some example embodiments of the inventive concepts, detailed descriptions of the same content as those of the above-described embodiments will be omitted.

Referring to FIG. 3A, the method of manufacturing the semiconductor device in accordance with some example embodiments of the inventive concepts may include forming sacrificial insulating patterns 1 filling storage electrode holes H, after forming the storage electrode holes H by performing processes described with reference to FIGS. 2A and 2B.

The forming the sacrificial insulating patterns 1 may include forming a sacrificial insulating material layer on the first hard mask layer M1 to cover the first hard mask layer M1 and to fill the storage electrode holes H, and removing the sacrificial insulating material layer to expose an upper surface of the first hard mask layer M1 by performing a planarization process such as a CMP process. The upper surface of the first hard mask layer M1 may be substantially coplanar with upper surfaces of the sacrificial insulating patterns 1. The sacrificial insulating layer may include an SOH.

Referring to FIG. 3B, the method may include reforming the storage electrode holes H exposing upper surfaces of the via pads 53 by removing the sacrificial insulating patterns 1 by performing an etching process.

Hereafter, the semiconductor device 100A shown in FIG. 1A may be formed by performing processes described with reference to FIG. 2C, FIG. 2D, FIG. 2E, FIG. 2F, FIG. 2G, FIG. 2H, FIG. 2I, FIG. 2J, FIG. 2K, and FIG. 2M.

FIG. 4A, FIG. 4B, FIG. 4C, FIG. 4D, FIG. 4E, FIG. 4F, and FIG. 4G are longitudinal cross-sectional views illustrating a method of manufacturing a semiconductor device in accordance with some example embodiments of the inventive concepts. In some example embodiments of the inventive concepts, detailed descriptions of the same content as those of the above-described embodiments will be omitted.

Figure 4A:
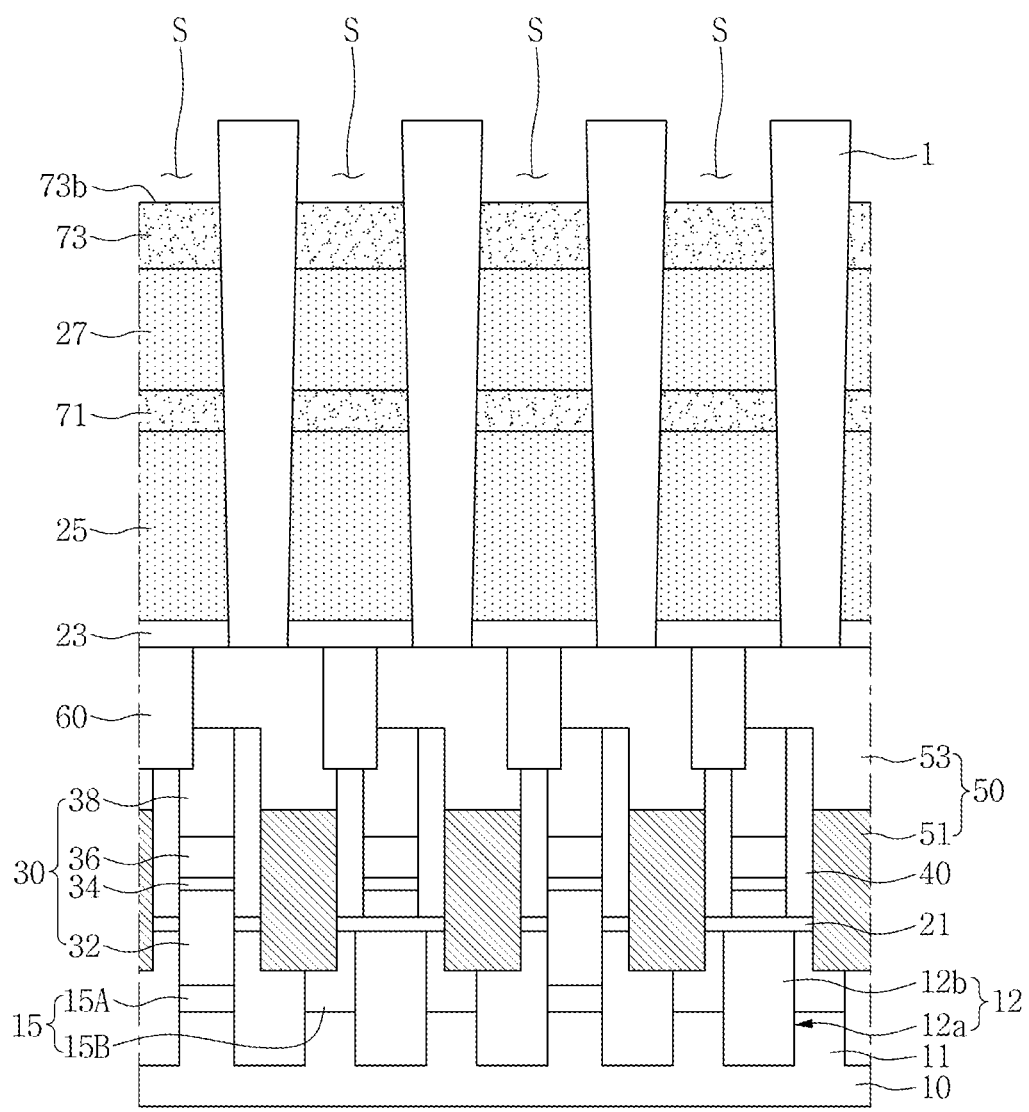
FIG. 4A, FIG. 4B, FIG. 4C, FIG. 4D, FIG. 4E, FIG. 4F, and FIG. 4G are longitudinal cross-sectional views illustrating a method of manufacturing a semiconductor device in accordance with some example embodiments of the inventive concepts.

Referring to FIG. 4A, the method of manufacturing the semiconductor device in accordance with some example embodiments of the inventive concepts may include removing the first hard mask layer M1 by performing an etching process, after forming sacrificial insulating patterns 1 filling the storage electrode holes H by performing processes described with reference to FIGS. 2A, 2B and 3A. Accordingly, spaces S exposing upper surfaces 73b of the second supporter 73 and upper sidewalls of the sacrificial insulating pattern 1 may be formed.

Figure 4B:
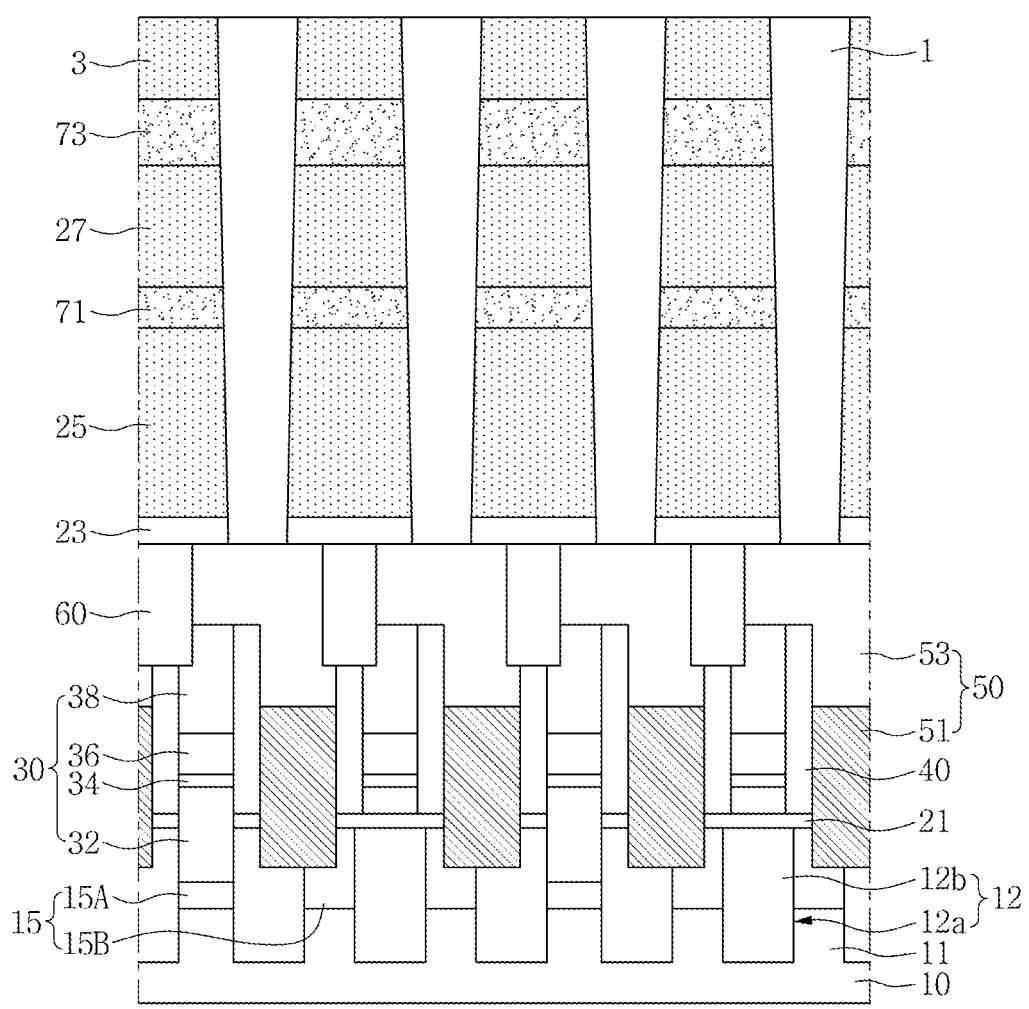

Referring to FIG. 4B, the method may include forming insulating patterns 3 filling the spaces S by performing a deposition process. The forming of the insulating patterns 3 may include forming an insulating material layer filling the spaces S and covering the sacrificial insulating pattern 1, and removing the insulating material layer to expose the upper surfaces of the sacrificial insulating patterns 1 by performing an etching process. In some example embodiments, the insulating material layer may include the same material as the lower molding layer 25 and the upper molding layer 27. For example, the insulating material layer may include silicon oxide (SiO2). Since the first hard mask layer M1 including polysilicon is removed and the insulating patterns 3 including silicon oxide is formed, it can prevent that by-products are generated at an interface between the insulating patterns 3 and the storage electrodes 81 when the storage electrodes 81 are formed in a subsequent process.

Figure 4C:
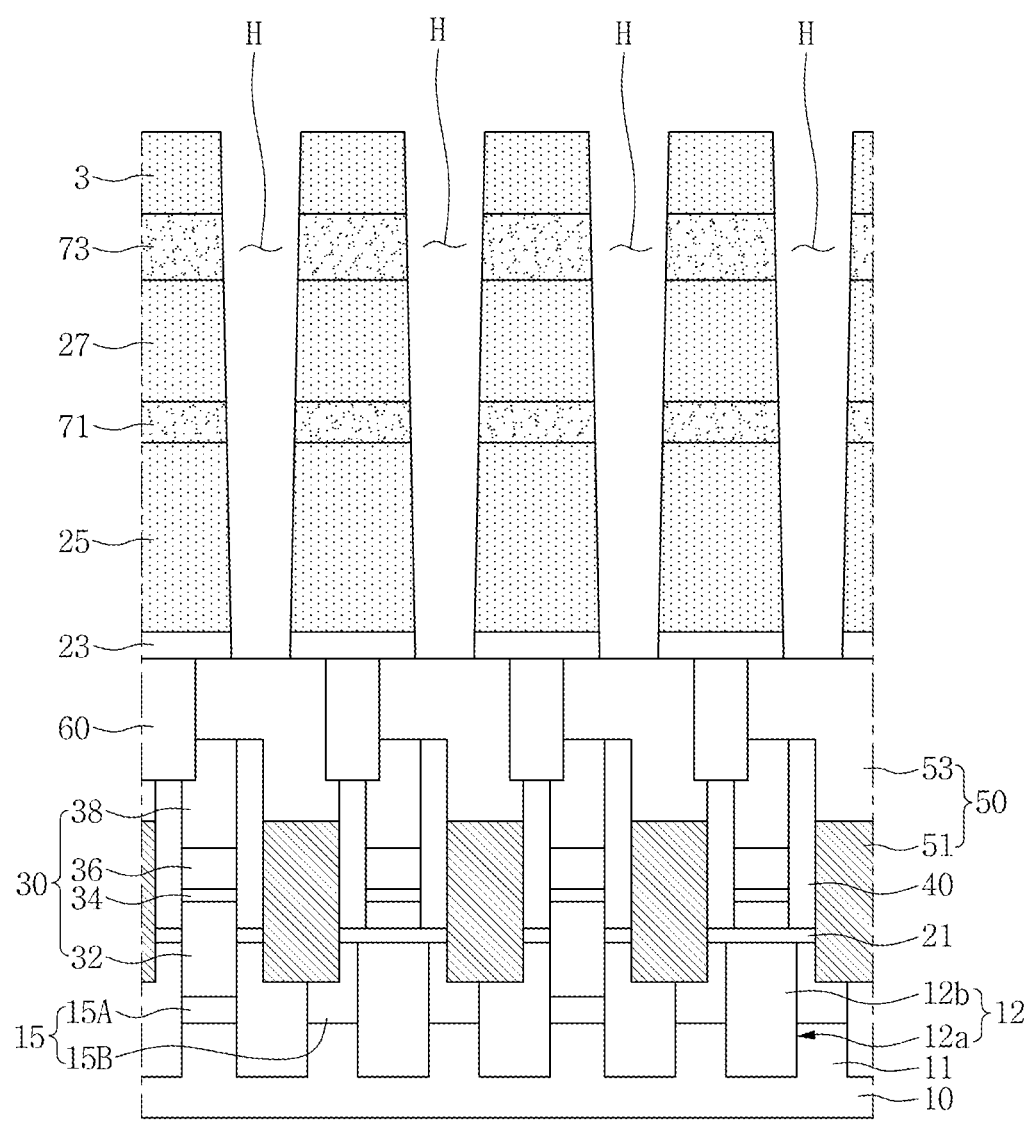

Referring to FIG. 4C, the method may include reforming the storage electrode holes H exposing upper surfaces of the via pads 53 by removing the sacrificial insulating patterns 1 by performing an etching process.

Figure 4D:
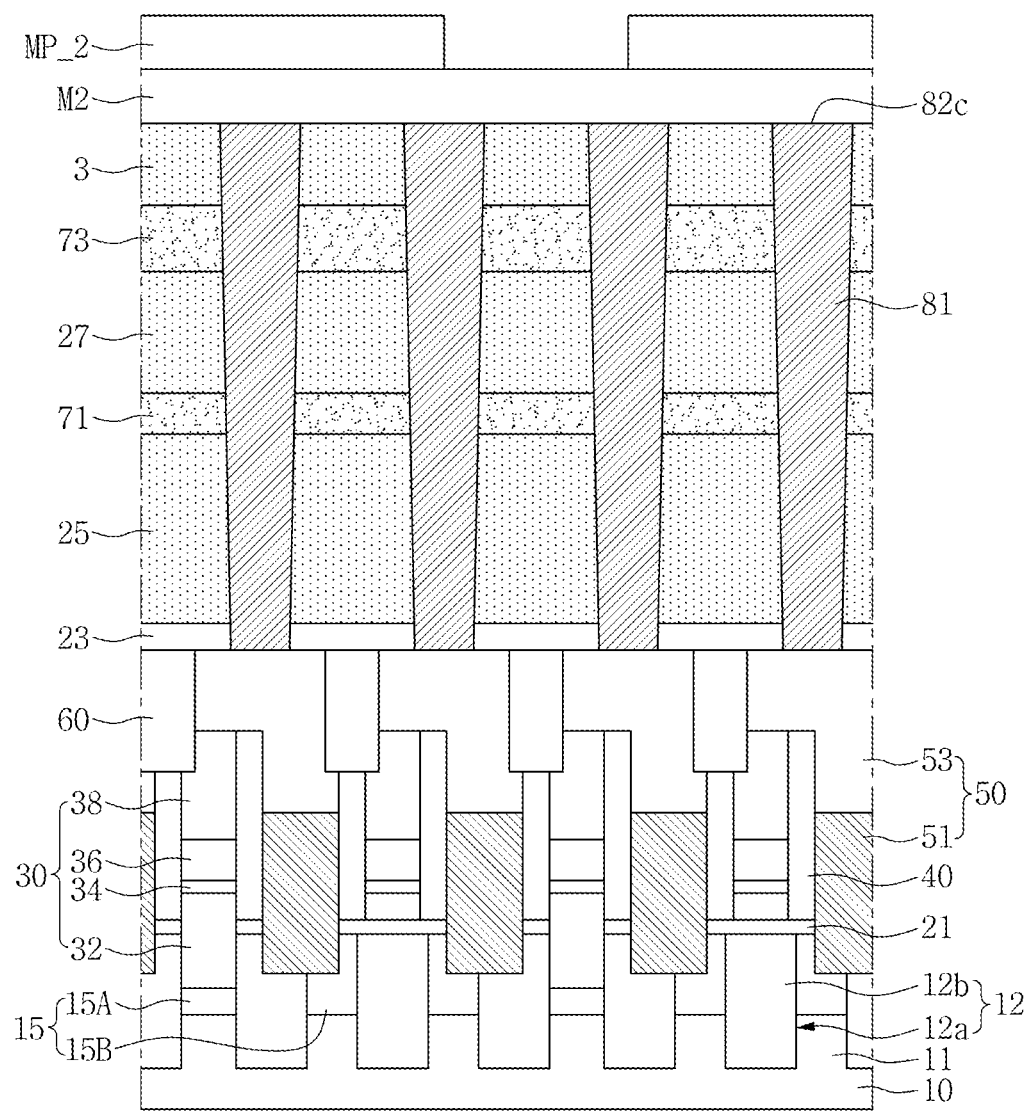

Referring to FIG. 4D, the method may include forming the storage electrodes 81 in the storage electrode holes H. As further shown in FIG. 4D, the method may include forming a second hard mask layer M2 covering the upper surfaces of the insulating patterns 3 and the upper surfaces 82c of the storage electrodes 81, and forming a second mask pattern MP_2 that selectively exposes the second hard mask layer M2 on the second hard mask layer M2.

Figure 4E:
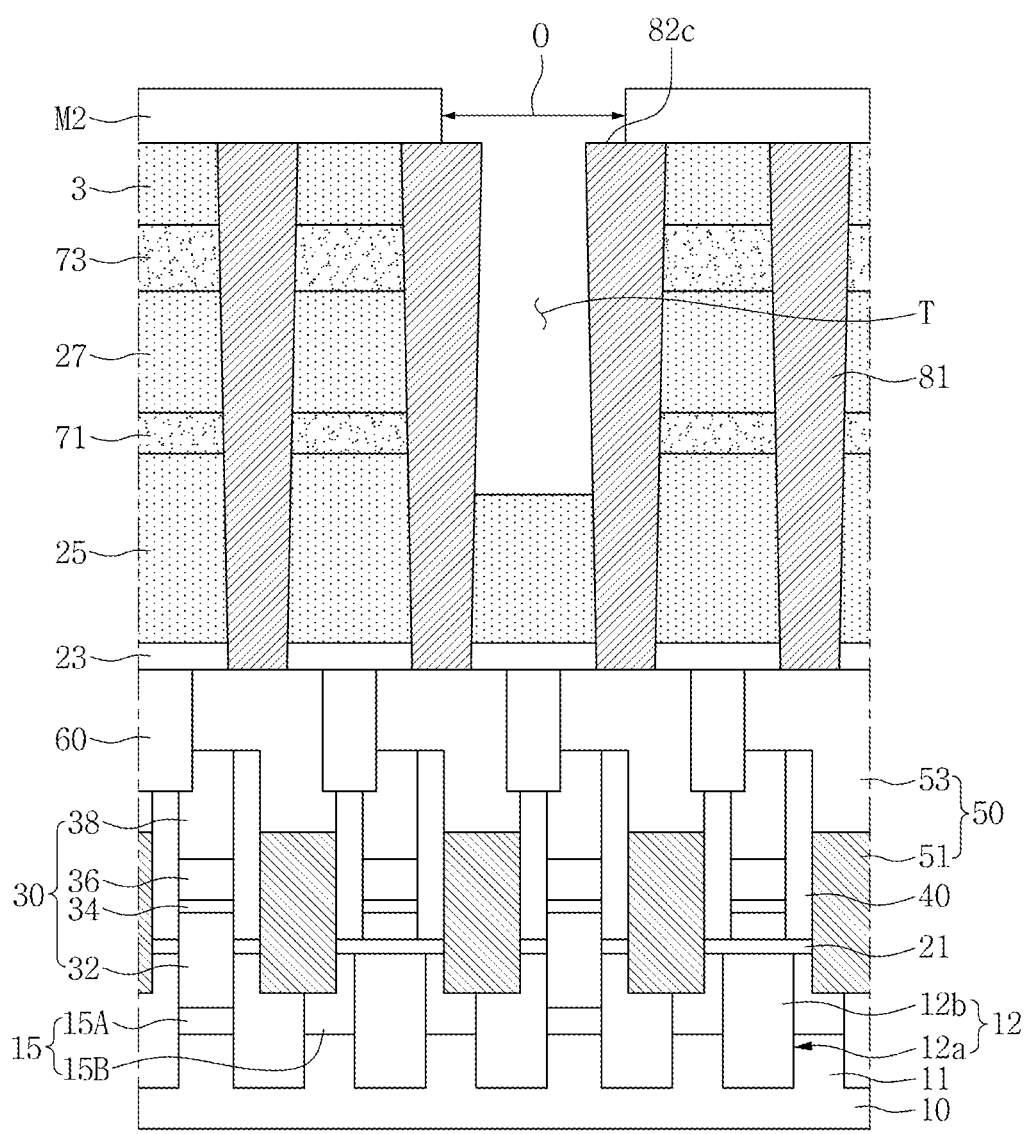

Referring to FIG. 4E, the method may include forming an opening O exposing a part of the upper surfaces of the insulating patterns 3 and a part of the upper surfaces 82c of the storage electrodes 81 by patterning the second hard mask layer M2 exposed through the second mask pattern MP_2 by performing an etching process, and forming a trench T exposing the upper surface of the lower molding layer 25 by sequentially removing the insulating pattern 3, the second supporter 73, the upper molding layer 27, the first supporter 71, and a part of the lower molding layer 25, which vertically overlap the opening O, by performing an etching process. In this process, the second mask pattern MP_2 may be removed.

Figure 4F:
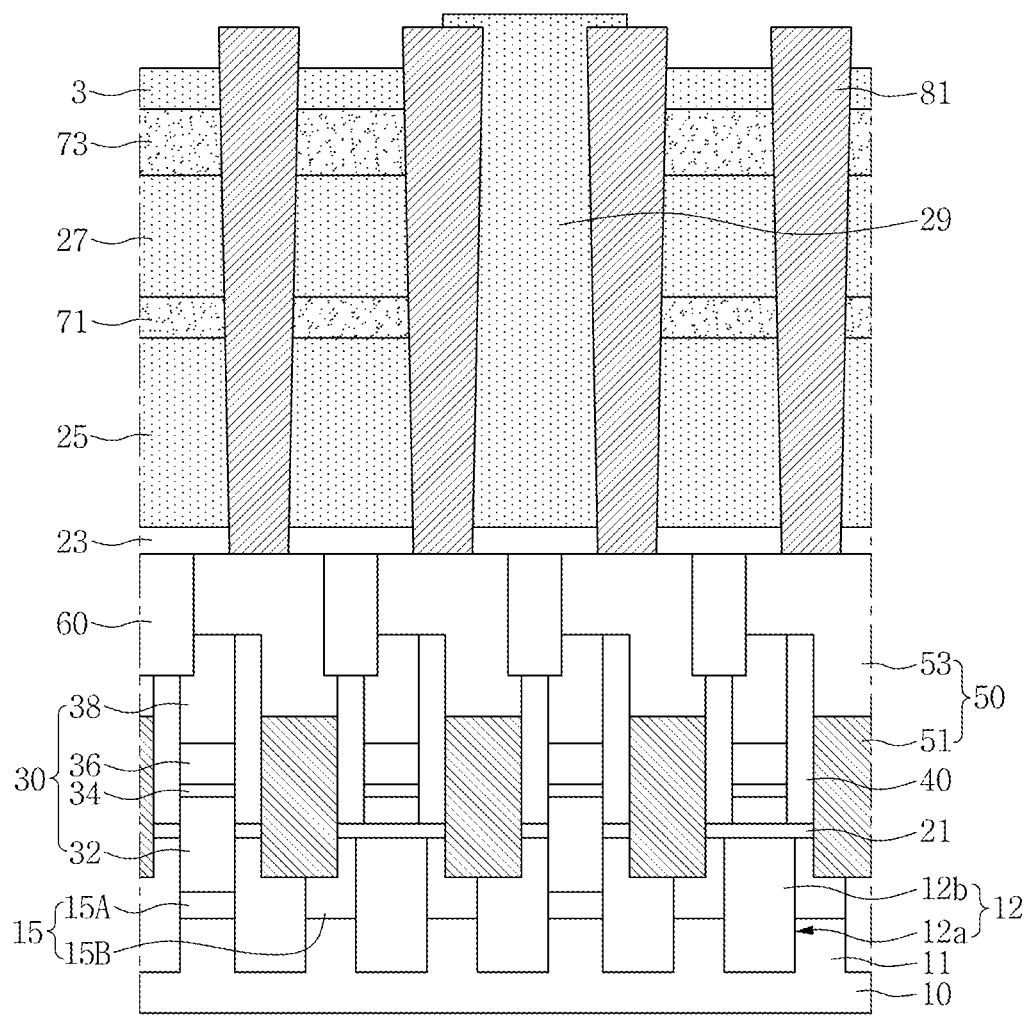

Referring to FIG. 4F, the method may include forming a trench capping layer 29 filling the trench T (see FIG. 4E), removing the second hard mask layer M2 (see FIG. 4E) by performing an etching process, and partially removing the insulating patterns 3 by performing an etch-back process. In the process partially removing the insulating patterns 3, a level of the upper surface of the trench capping layer 20 may be lowered.

Figure 4G:
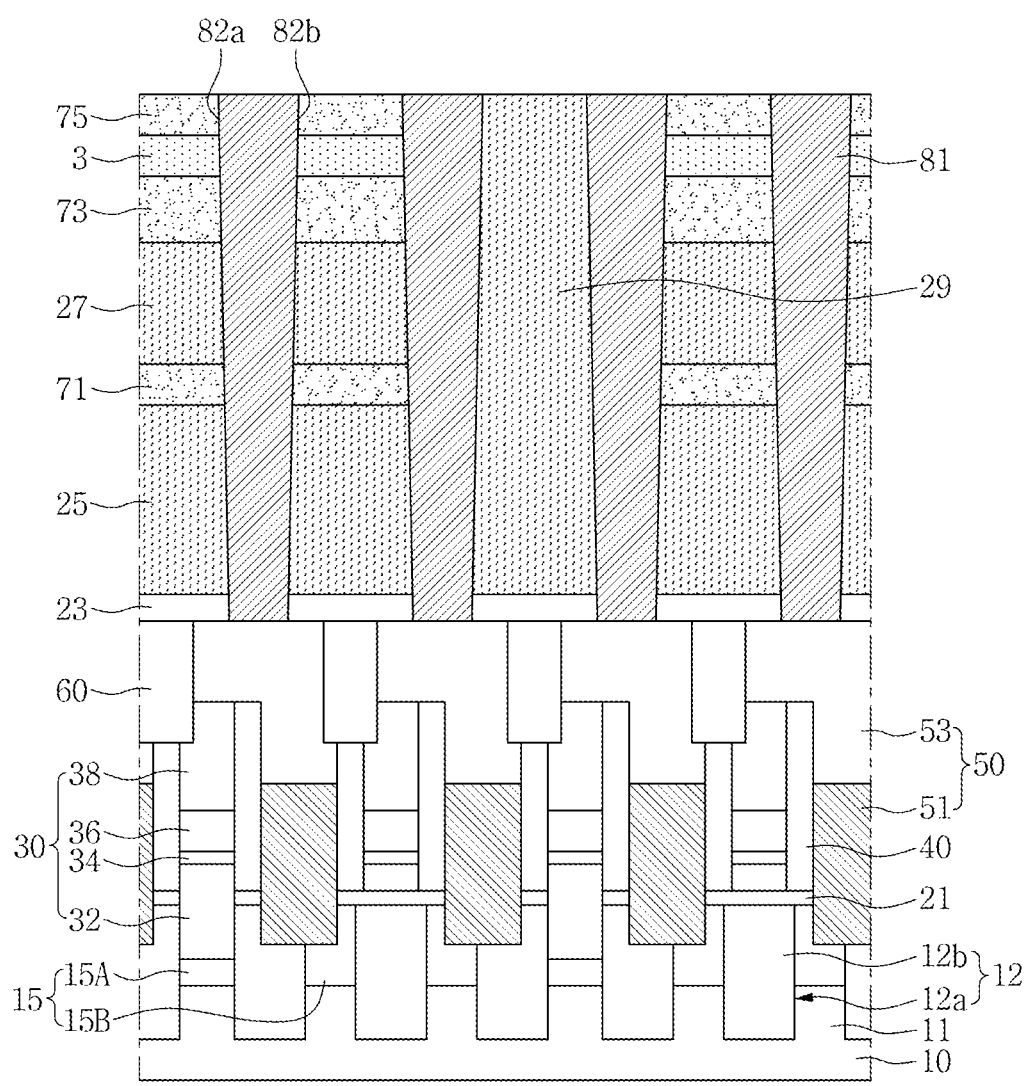

Referring to FIG. 4G, the method may include forming a third supporter 75 in spaces defined by the upper surfaces of the insulating patterns 3 and upper sidewalls 82a, 82b of the storage electrodes 81.

Hereafter, the semiconductor device 100A in FIG. 1A may be formed by performing processes described with reference to FIG. 2J, FIG. 2K, FIG. 2L, and FIG. 2M.

Figure 5A:
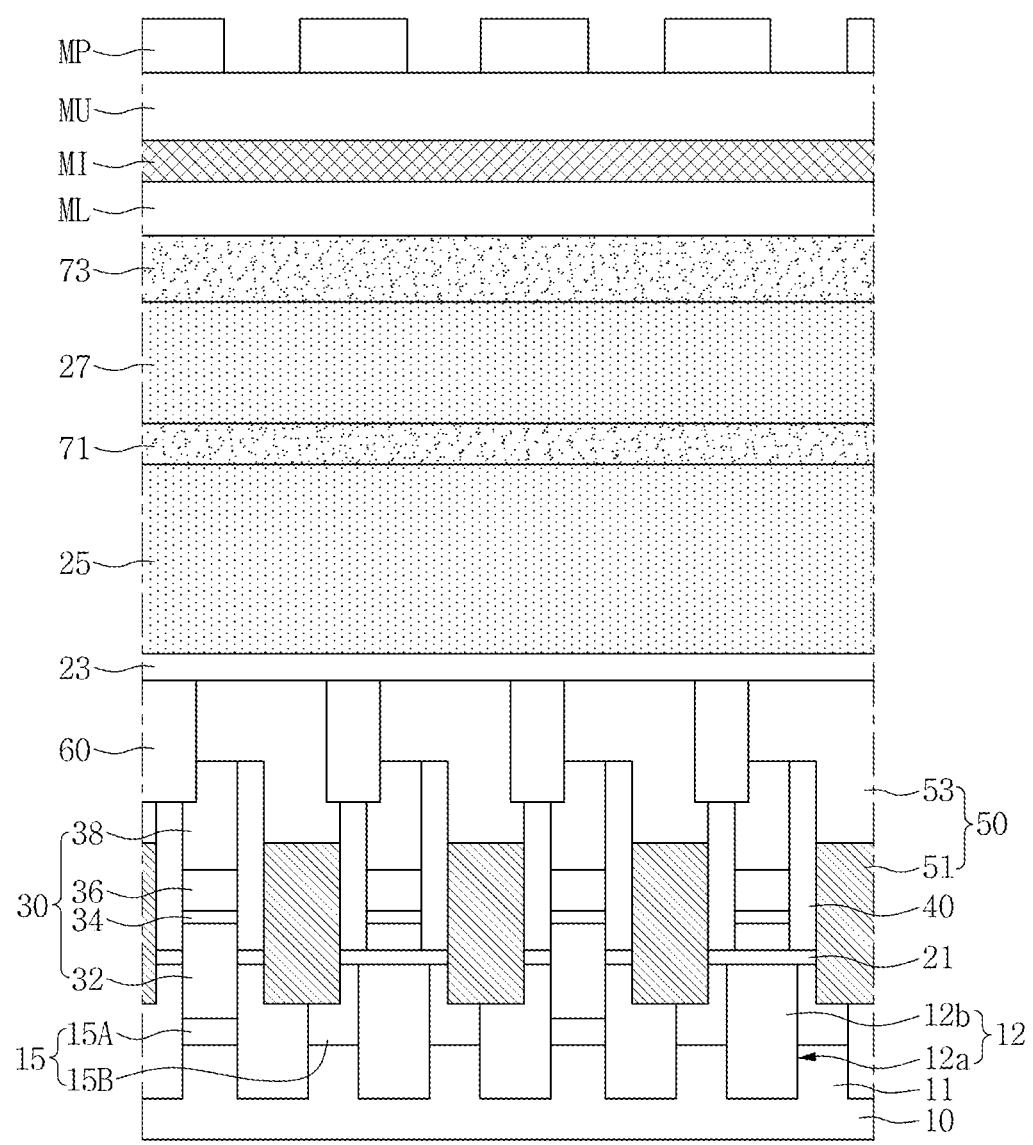
FIG. 5A and FIG. 5B are longitudinal cross-sectional views illustrating a method of manufacturing a semiconductor device in accordance with some example embodiments of the inventive concepts.
Figure 5B:
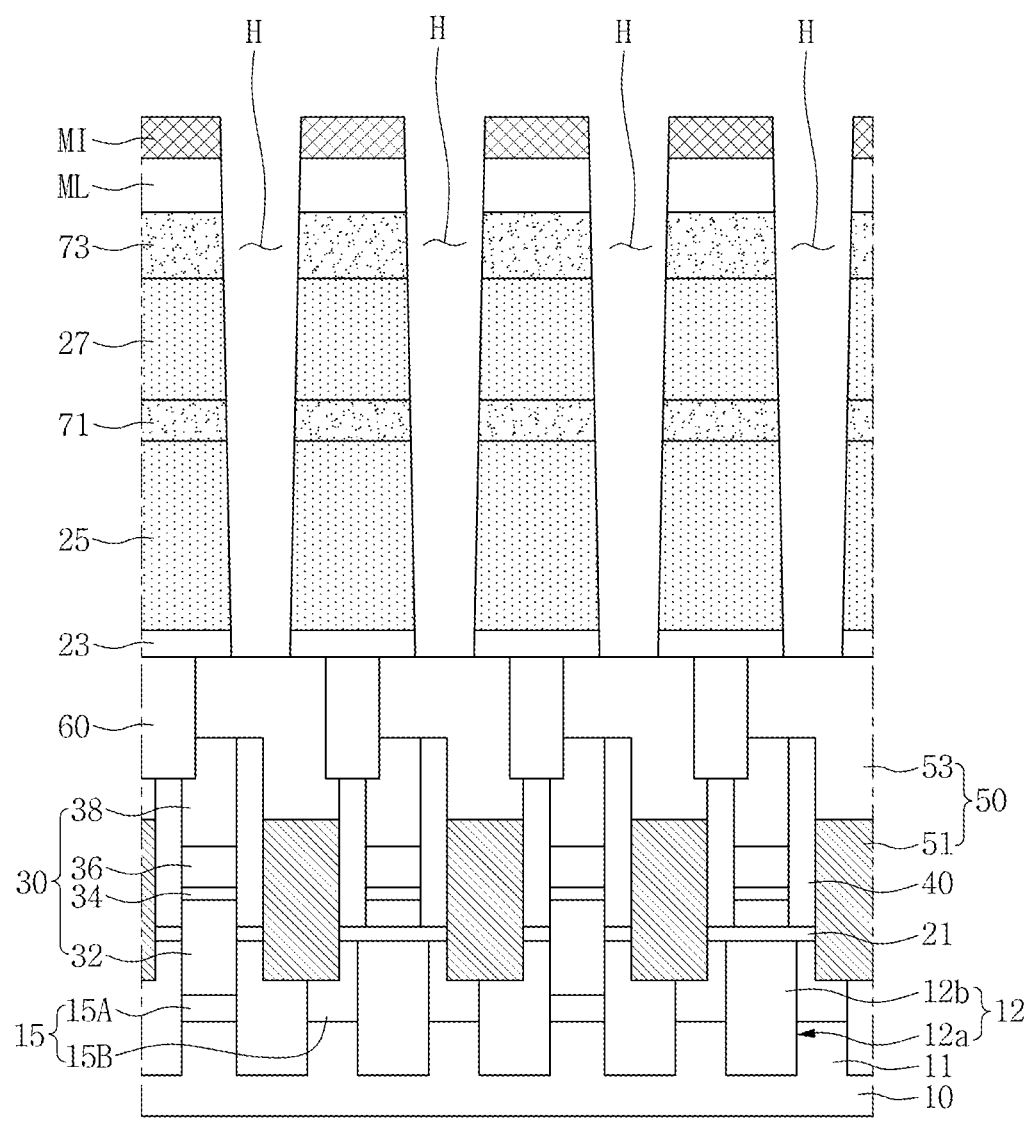

FIG. 5A and FIG. 5B are longitudinal cross-sectional views illustrating a method of manufacturing a semiconductor device in accordance with some example embodiments of the inventive concepts. In some example embodiments of the inventive concepts, detailed descriptions of the same content as those of the above-described embodiments will be omitted.

Referring to FIG. 5A, the method of manufacturing the semiconductor device in accordance with some example embodiments of the inventive concepts may include preparing a substrate 10, forming device isolation regions 12 defining active regions 11 in the substrate 10, forming source/drain areas 15 in the substrate 10, forming an interlayer insulating layer 21 on the substrate 10, forming bit line structures 30 on the substrate 10, forming via structures 50 between the bit line structures 30 on the substrate 10, forming an etch stop layer 23 covering the via structures 50, and sequentially forming a lower molding layer 25, a first supporter 71, an upper molding layer 27, a second supporter 73, a lower hard mask layer ML, an intermediate hard mask layer MI, an upper hard mask layer MU, and a mask pattern MP. The intermediate hard mask layer MI may include a material having an etch selectivity with respect to the lower hard mask layer ML and the upper hard mask layer MU. The lower hard mask layer ML and the upper hard mask layer MU may include the same material as each other. For example, the lower hard mask layer ML and the upper hard mask layer MU may include polysilicon. The intermediate hard mask layer MI may include silicon nitride (SiN) or silicon carbonitride (SiCN). The intermediate hard mask layer MI may be used as an etch stop layer when storage electrode holes H (see FIG. 5B) are formed in a subsequent process.

Referring to FIG. 5B, the method may include forming the storage electrode holes H exposing upper surfaces of the via pads 53 by patterning the upper hard mask layer MU, the intermediate hard mask layer MI, the lower hard mask layer ML, the second supporter 73, the upper molding layer 27, the first supporter 71, the lower molding layer 25, and the etch stop layer 23 using the mask pattern MP as an etching mask. In this process, the mask pattern MP and the upper hard mask layer MU may be removed. In some example embodiment, the method may include fully removing a residue that includes the upper hard mask layer MU remaining on the intermediate hard mask layer MI by performing a partial etch-back process. In some example embodiment, the method may further include removing the intermediate hard mask layer MI by performing an etching process.

Hereafter, the semiconductor device 100A shown in FIG. 1A may be formed by performing processes described with reference to FIG. 2C, FIG. 2D, FIG. 2E, FIG. 2F, FIG. 2G, FIG. 2H, FIG. 2I, FIG. 2J, FIG. 2K, and FIG. 2M.

Figure 6:
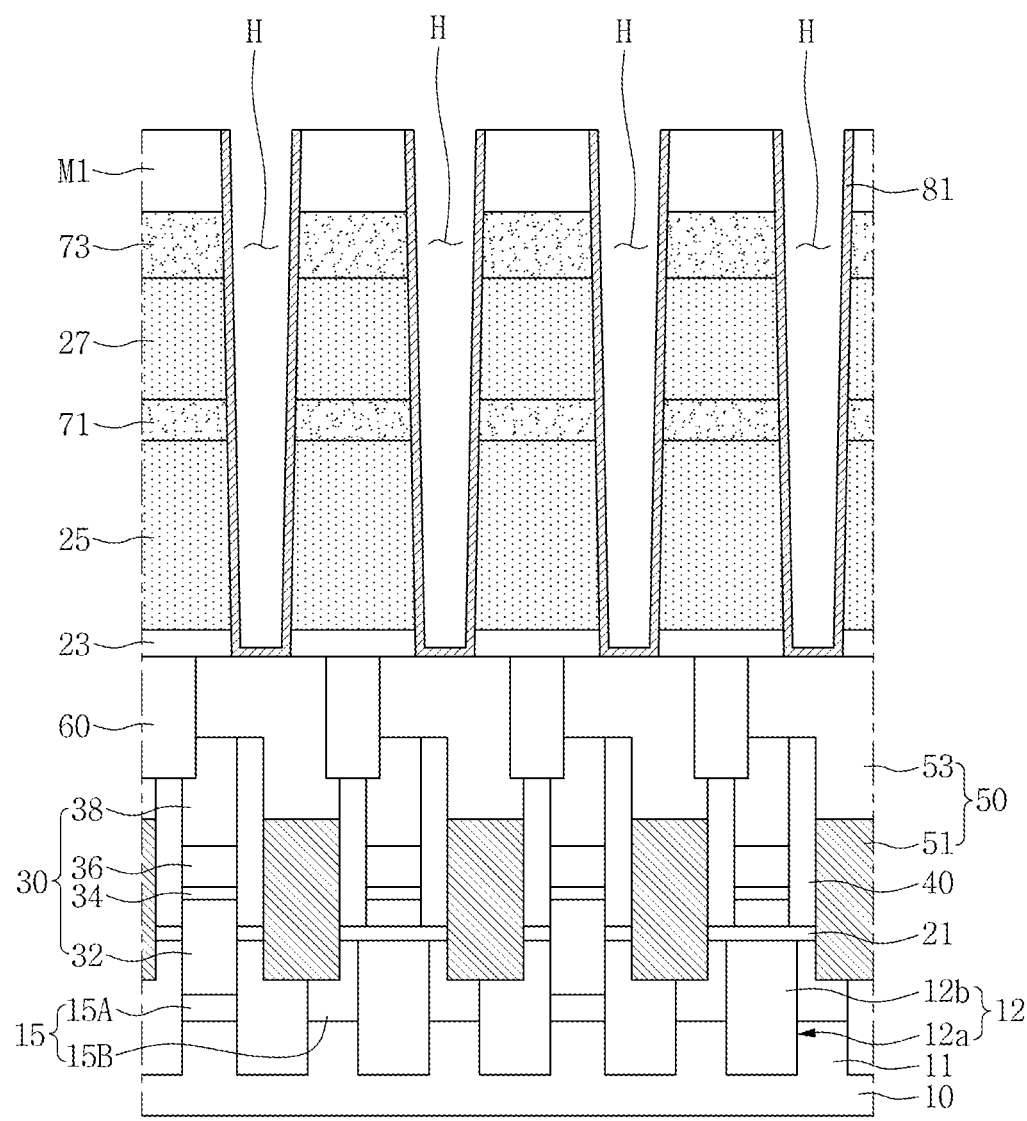
FIG. 6 is a longitudinal cross-sectional view illustrating a method of manufacturing a semiconductor device in accordance with some example embodiments of the inventive concepts.

FIG. 6 is a longitudinal cross-sectional view illustrating a method of manufacturing a semiconductor device in accordance with some example embodiments of the inventive concepts. In some example embodiments of the inventive concepts, detailed descriptions of the same content as those of the above-described embodiments will be omitted.

Referring to FIG. 6, the method of manufacturing the semiconductor device in accordance with some example embodiments of the inventive concepts may include forming storage electrodes 81 conformally covering bottom surfaces and inner sidewalls of storage electrode holes H, after forming the storage electrode holes H by performing processes described with reference to FIGS. 2A and 2B. The storage electrodes 81 may have cylindrical shapes.

Hereafter, the semiconductor device 100B shown in FIG. 1B may be formed by performing processes described with reference to FIG. 2D, FIG. 2E, FIG. 2F, FIG. 2G, FIG. 2H, FIG. 2I, FIG. 2J, FIG. 2K, and FIG. 2M.

FIG. 7A, FIG. 7B, FIG. 7C, FIG. 7D, FIG. 7E, and FIG. 7F are longitudinal cross-sectional views illustrating a method of manufacturing a semiconductor device in accordance with some example embodiments of the inventive concepts. In some example embodiments of the inventive concepts, detailed descriptions of the same content as those of the above-described embodiments will be omitted.

Figure 7A:
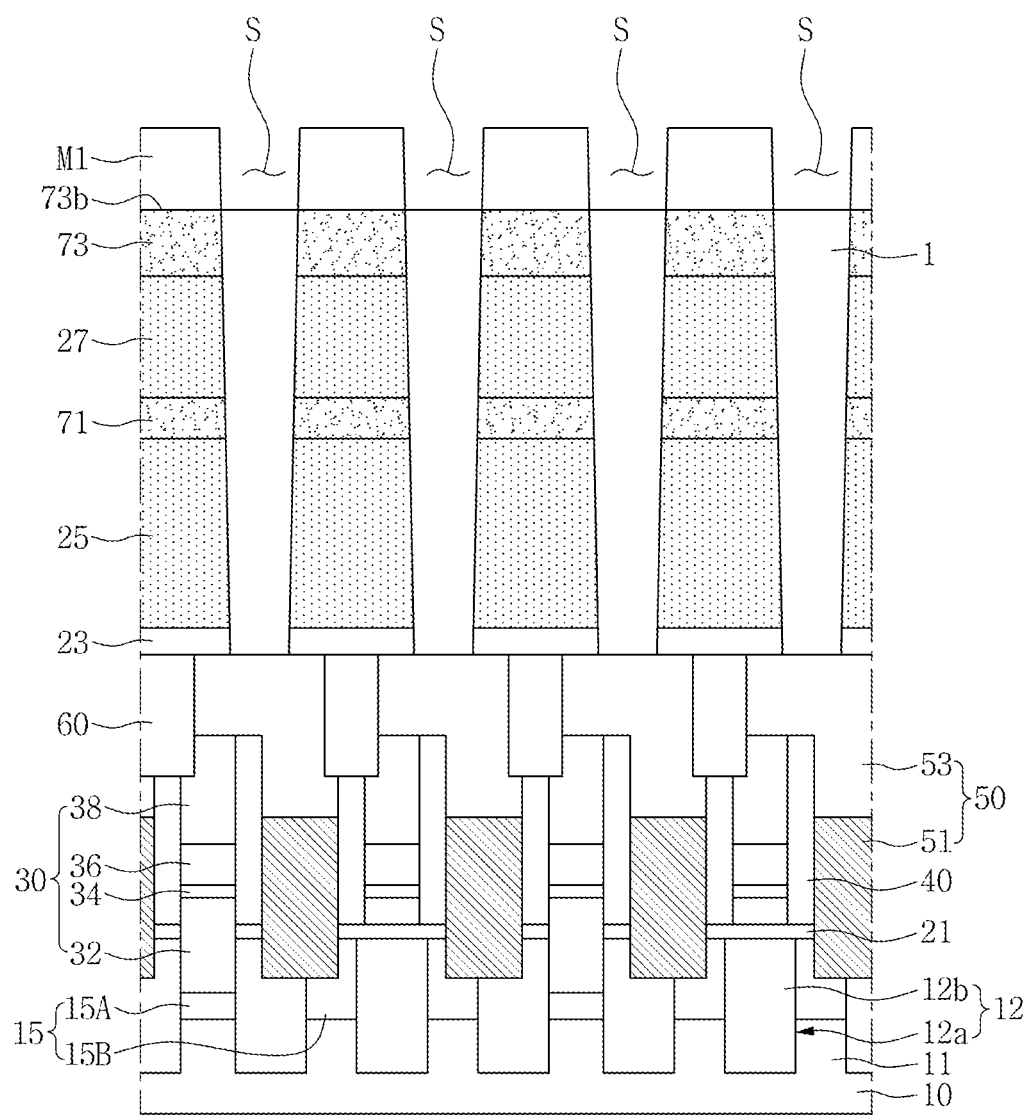
FIG. 7A, FIG. 7B, FIG. 7C, FIG. 7D, FIG. 7E, and FIG. 7F are longitudinal cross-sectional views illustrating a method of manufacturing a semiconductor device in accordance with some example embodiments of the inventive concepts.

Referring to FIG. 7A, the method of manufacturing the semiconductor device in accordance with some example embodiments of the inventive concepts may include partially removing sacrificial insulating patterns 1 by performing an etch-back process, after forming sacrificial insulating patterns 1 filling the storage electrode holes H by performing processes described with reference to FIGS. 2A, 2B and 3A. In this process, upper surfaces of the sacrificial insulating patterns 1 may be located at lower levels than an upper surface of the first hard mask layer M1. In some example embodiment, the upper surfaces of the sacrificial insulating patterns 1 may be coplanar with an upper surface 73b of the second supporter 73. Accordingly, spaces S defined by side surfaces of the first hard mask layer M1 and the upper surfaces of the sacrificial insulating patterns 1 may be formed.

Figure 7B:
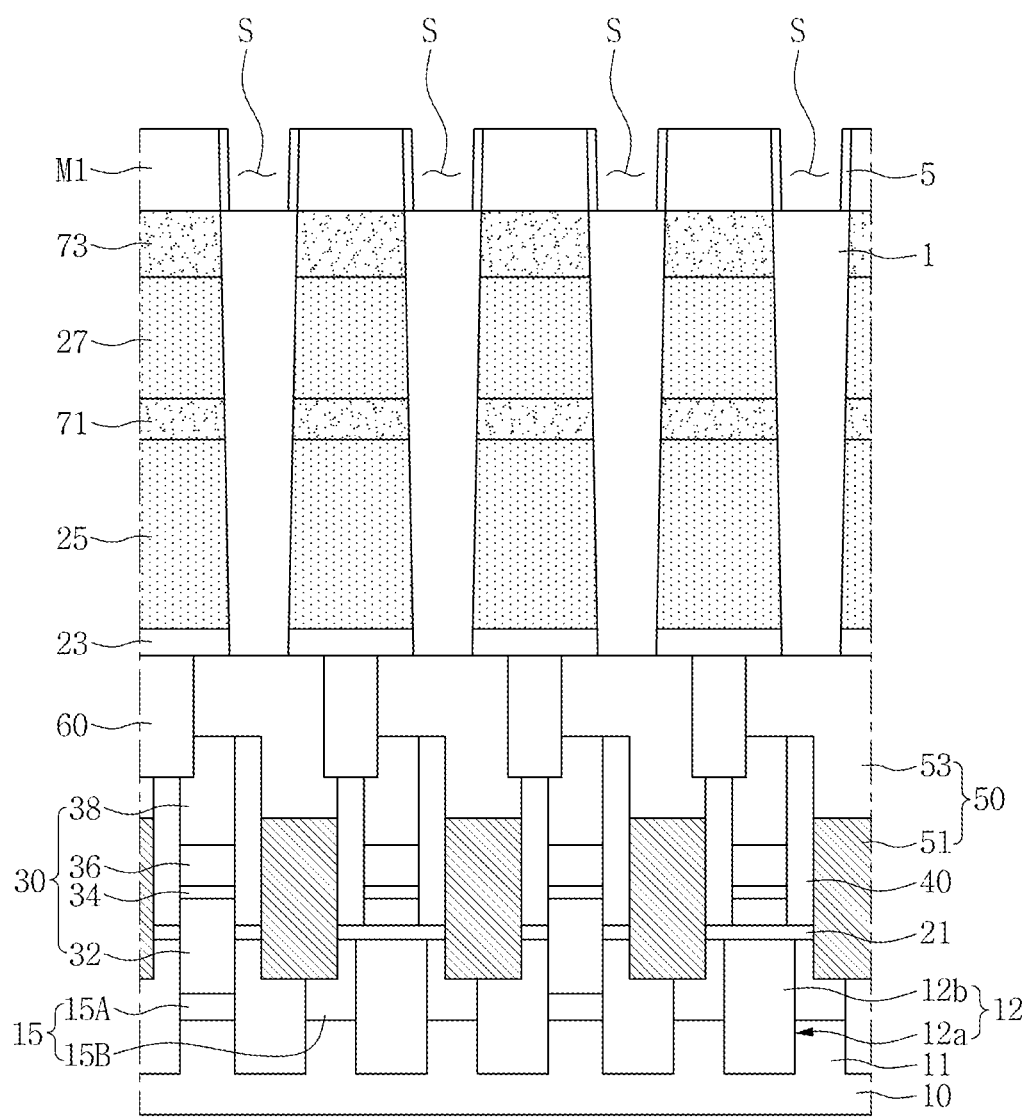

Referring to FIG. 7B, the method may include forming spacers 5 on the side surfaces of the first hard mask layer M1 exposed in the spaces S. The forming of the spacers 5 may include conformally forming a spacer material layer on the upper and side surfaces of the first hard mask layer M1 and the upper surfaces of the sacrificial insulating patterns 1 by performing a deposition process, and removing the spacer material layer on the upper surfaces of the first hard mask layer M1 and the sacrificial insulating patterns 1. The spacers 5 may include silicon nitride (SiN). Since the spacers 5 on the side surfaces of the first hard mask layer M1 is formed, it can prevent that by-products are generated at an interface between the first hard mask layer M1 and the storage electrodes 81 when the storage electrodes 81 are formed in a subsequent process.

Figure 7C:
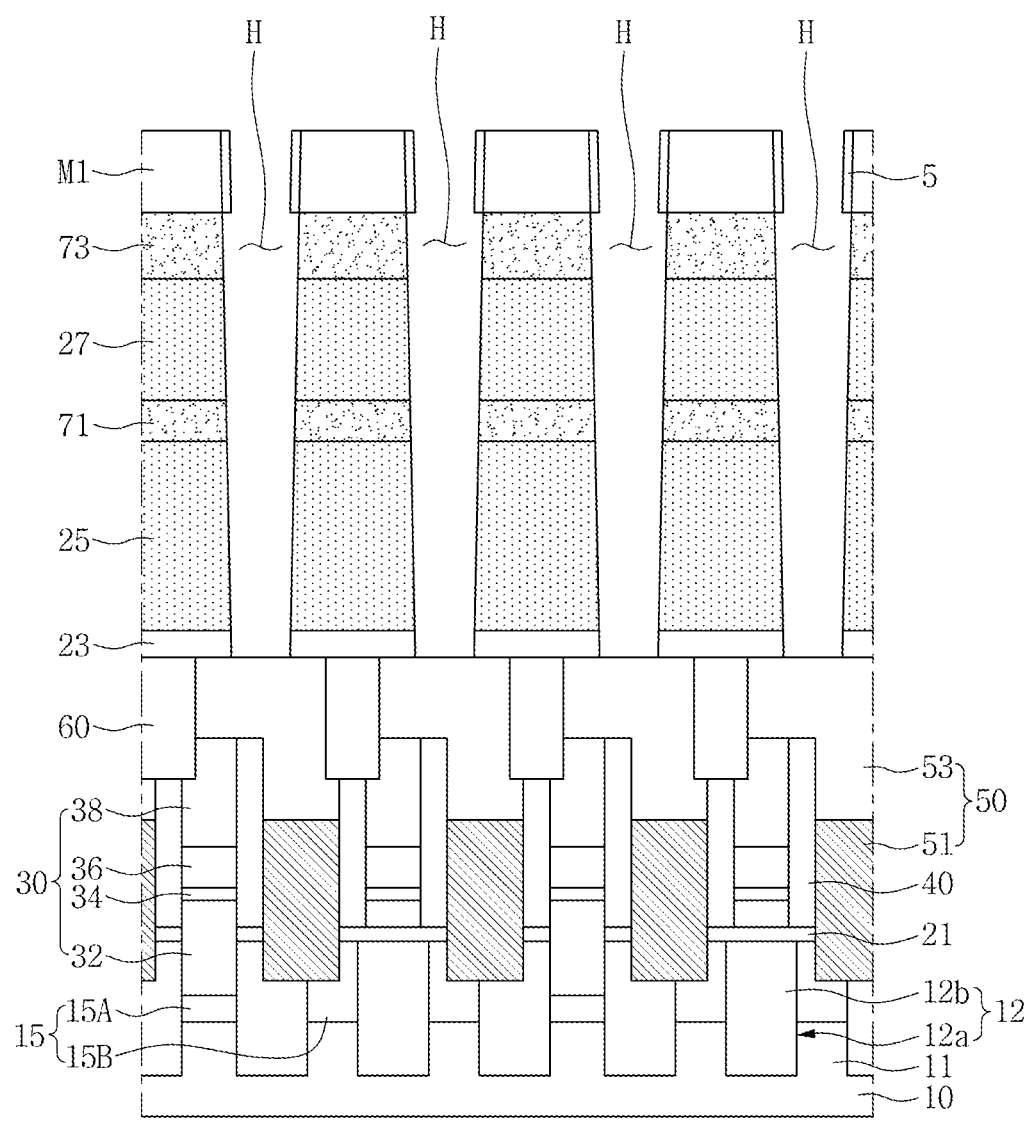

Referring to FIG. 7C, the method may include storage electrode holes H exposing the upper surfaces of the via pads 53 by removing the sacrificial insulating patterns 1 by performing an etching process. At this time, the spacers 5 may protrude toward insides of the storage electrode holes H.

Figure 7D:
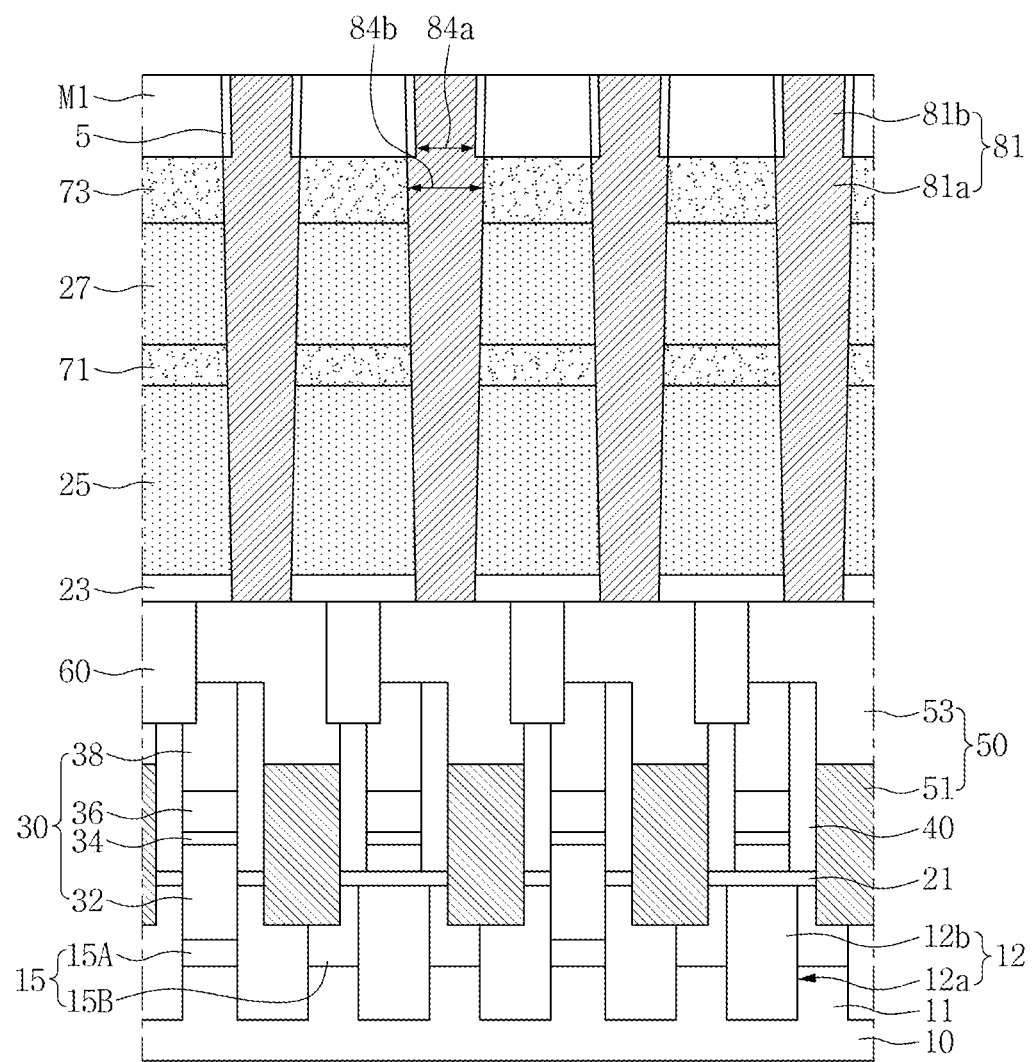

Referring to FIG. 7D, the method may include forming storage electrodes 81 filling the storage electrode holes H (see FIG. 7C). The storage electrodes 81 may include lower storage electrodes 81a in contact with the etch stop layer 23, the lower molding layer 25 the first supporter 71, the upper molding layer 27, and the second supporter 73 and upper storage electrodes 81b in contact with the spacers 5. Since the spacers 5 protrude toward the insides of the storage electrode holes H, horizontal widths 84a of the upper storage electrodes 81b may be smaller than horizontal widths 84b of the lower storage electrodes 81a in contact with the second supporter 73.

Figure 7E:
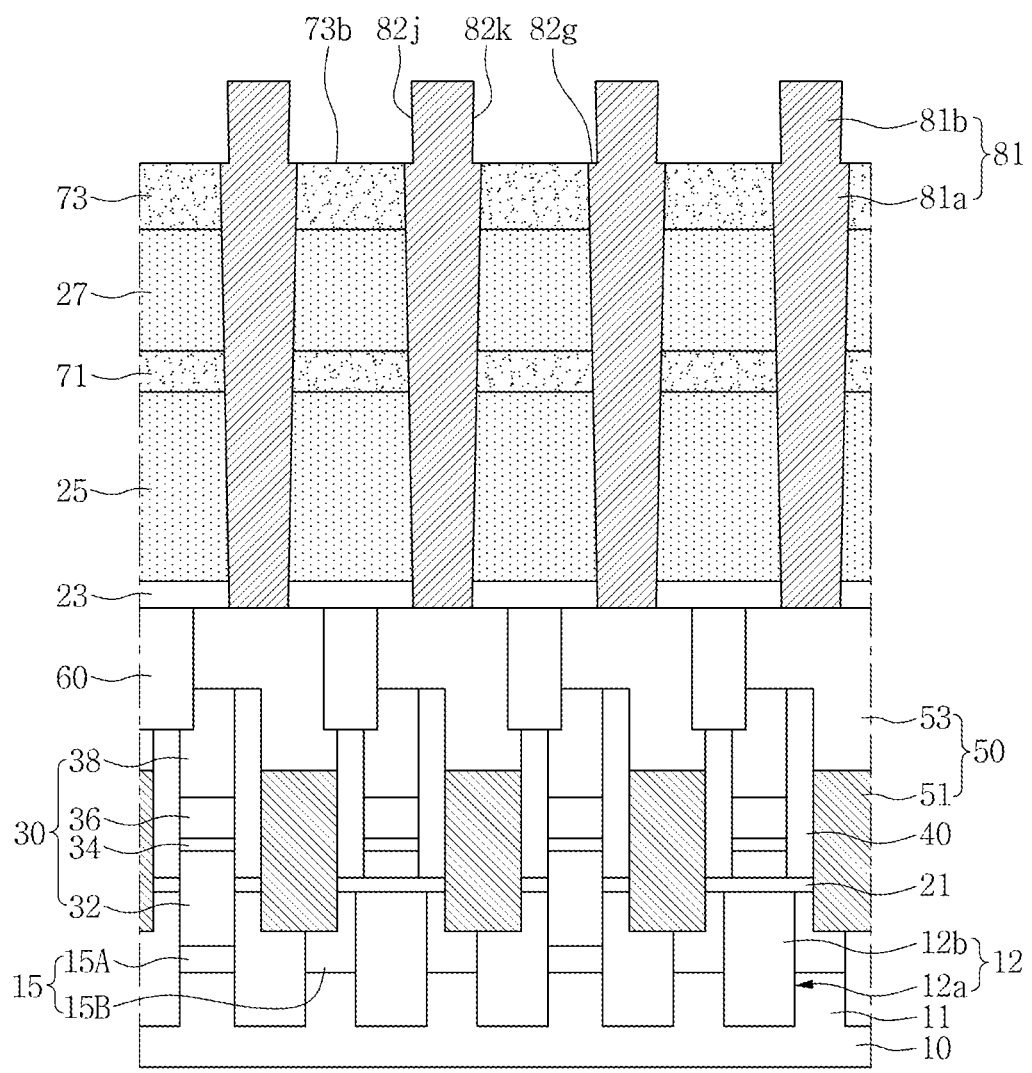

Referring to FIG. 7E, the method may include removing the first hard mask layer M1 by performing an etching process, and removing the spacers 5 by performing an etching process. In this process, upper surfaces 73b of the second supporter 73, upper surface 82g, and side surfaces 82j, 82k of the upper storage electrodes 81b may be exposed.

Figure 7F:
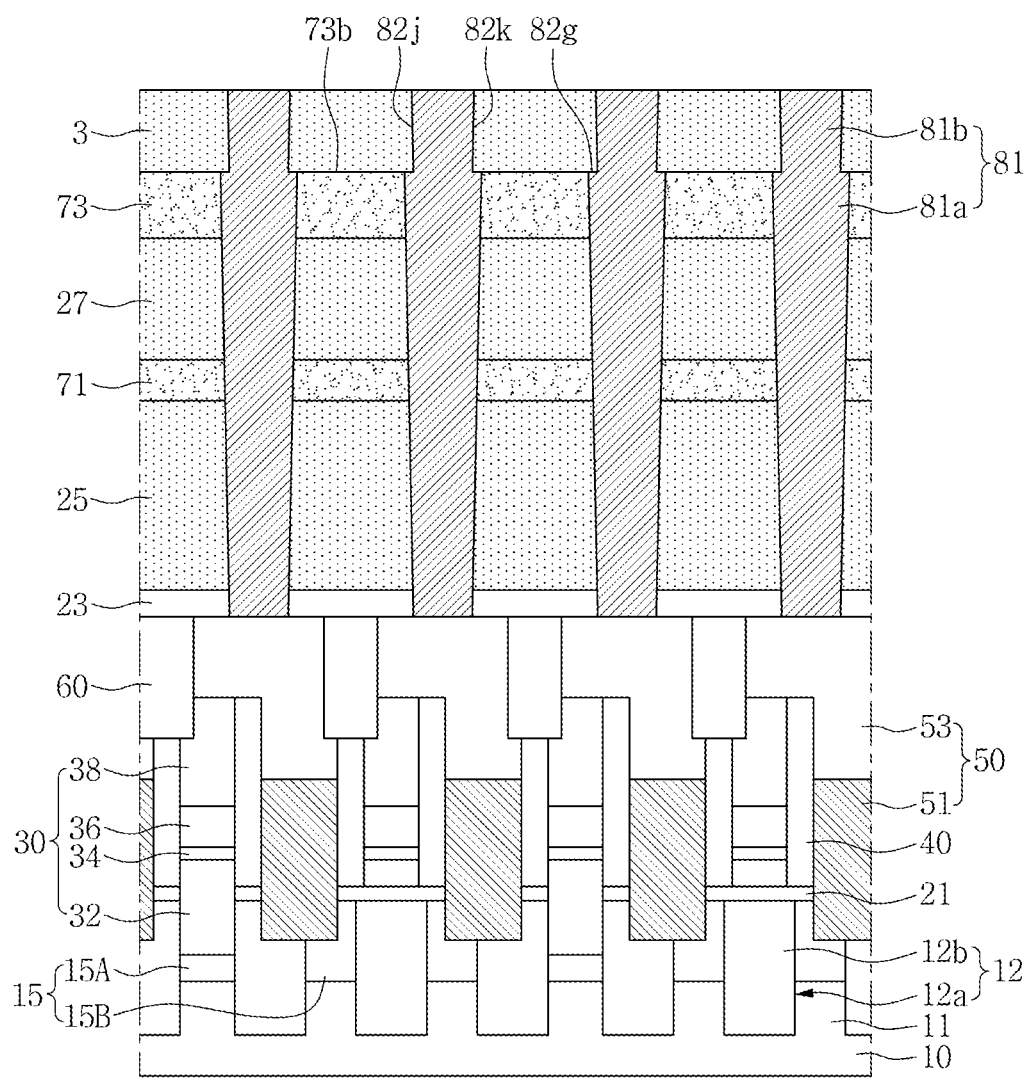

Referring to FIG. 7F, the method may include forming insulating patterns 3 covering the upper surfaces 73b of the second supporter 73, upper surfaces 82g, and surrounding the side surfaces 82j, 82k of the upper storage electrodes 81b.

Hereafter, the semiconductor device 100C in FIG. 1C may be formed by performing processes described with reference to FIG. 4D, FIG. 4E, FIG. 4F, and FIG. 4G and FIG. 2J, FIG. 2K, FIG. 2L, and FIG. 2M.

FIG. 8A, FIG. 8B, FIG. 8C, FIG. 8D, FIG. 8E, and FIG. 8F are longitudinal cross-sectional views illustrating a method of manufacturing a semiconductor device in accordance with some example embodiments of the inventive concepts. In some example embodiments of the inventive concepts, detailed descriptions of the same content as those of the above-described embodiments will be omitted.

Figure 8A:
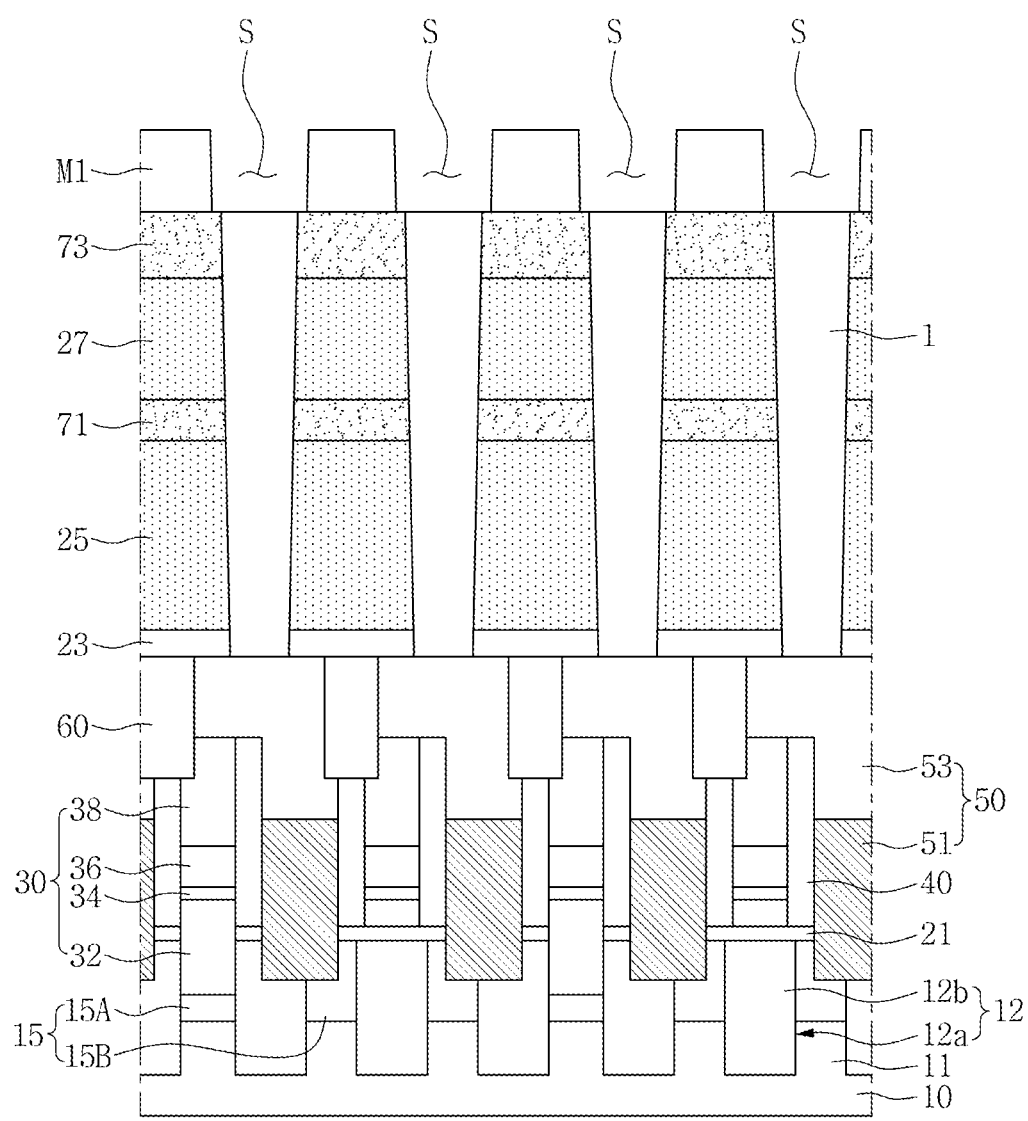
FIG. 8A, FIG. 8B, FIG. 8C, FIG. 8D, FIG. 8E, and FIG. 8F are longitudinal cross-sectional views illustrating a method of manufacturing a semiconductor device in accordance with some example embodiments of the inventive concepts.

Referring to FIG. 8A, the method of manufacturing the semiconductor device in accordance with some example embodiments of the inventive concepts may include extending horizontal widths of the spaces S by removing the first hard mask layer M1 in a horizontal direction by performing an etching process, after partially removing sacrificial insulating patterns 1 filling the storage electrode holes H by performing processes described with reference to FIGS. 2A, 2B, 3A and 7A. Accordingly, the horizontal widths of the spaces S may be greater than horizontal widths of upper surfaces of the sacrificial insulating patterns 1.

Figure 8B:
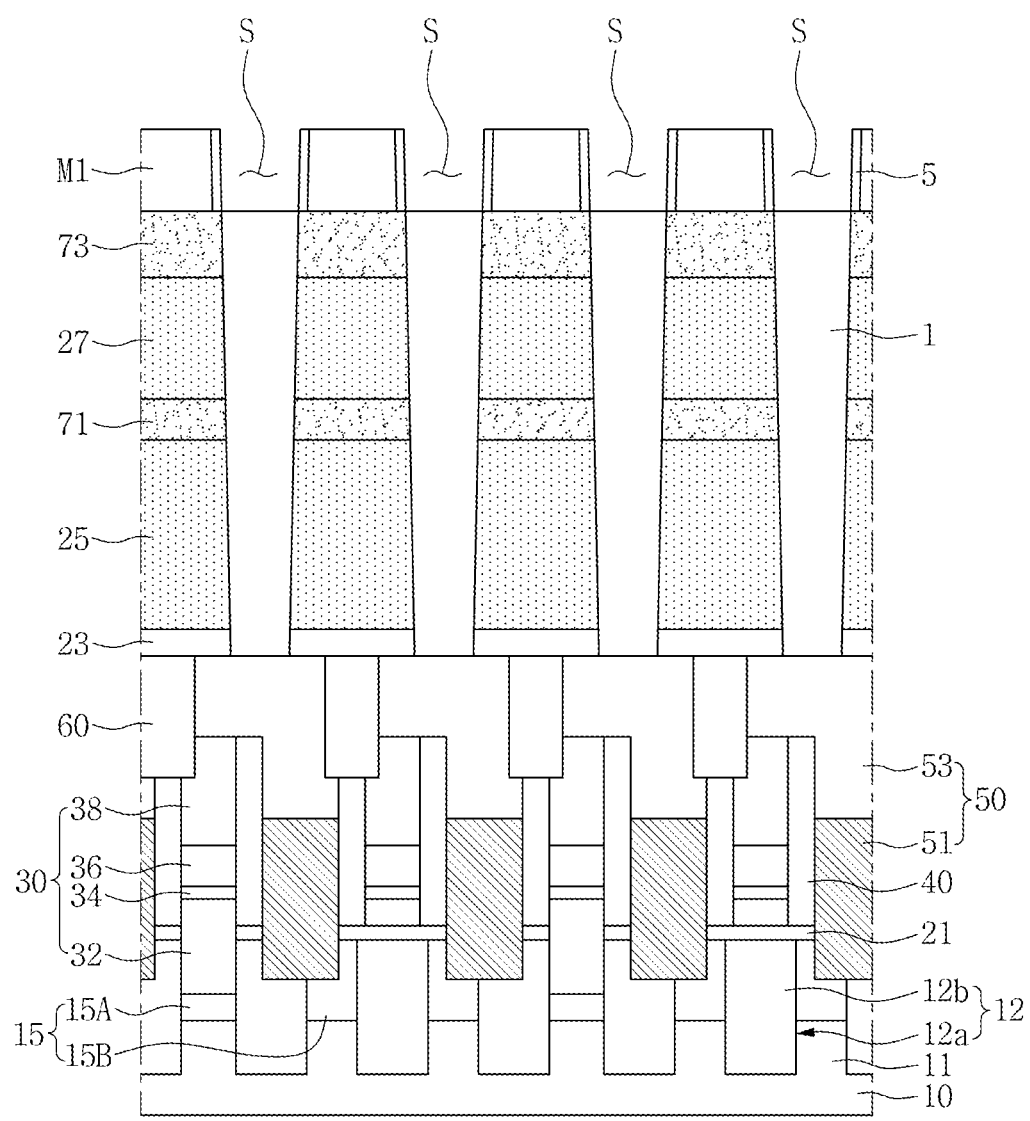

Referring to FIG. 8B, the method may include forming spacers 5 on side surfaces of the first hard mask layer M1 exposed in the spaces S. Outer side surfaces of the spacers 5 and sidewalls of the sacrificial insulating patterns 1 may be vertically aligned.

Figure 8C:
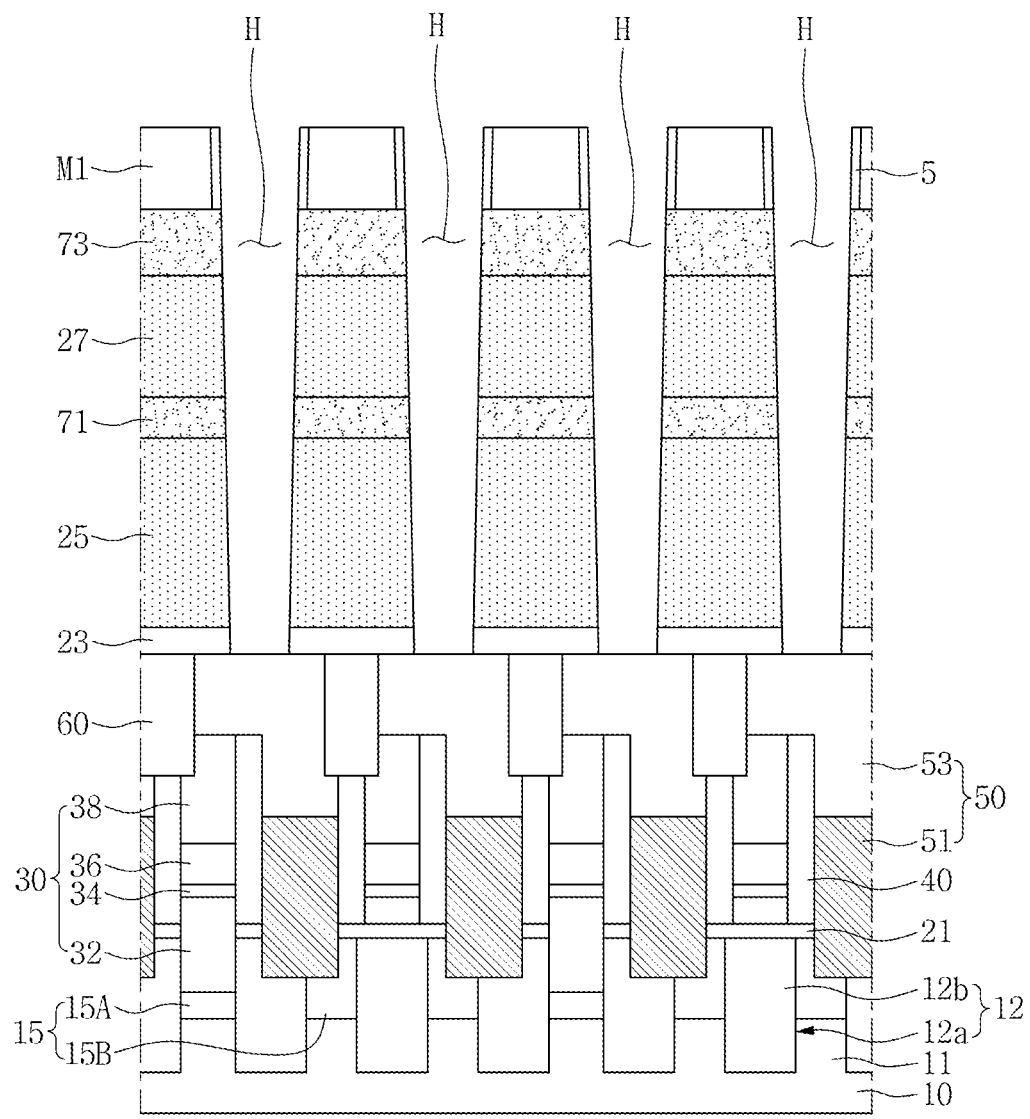

Referring to FIG. 8C, the method may include forming storage electrode holes H exposing the upper surfaces of the via pads 53 by removing the sacrificial insulating patterns 1 by performing an etching process.

Figure 8D:
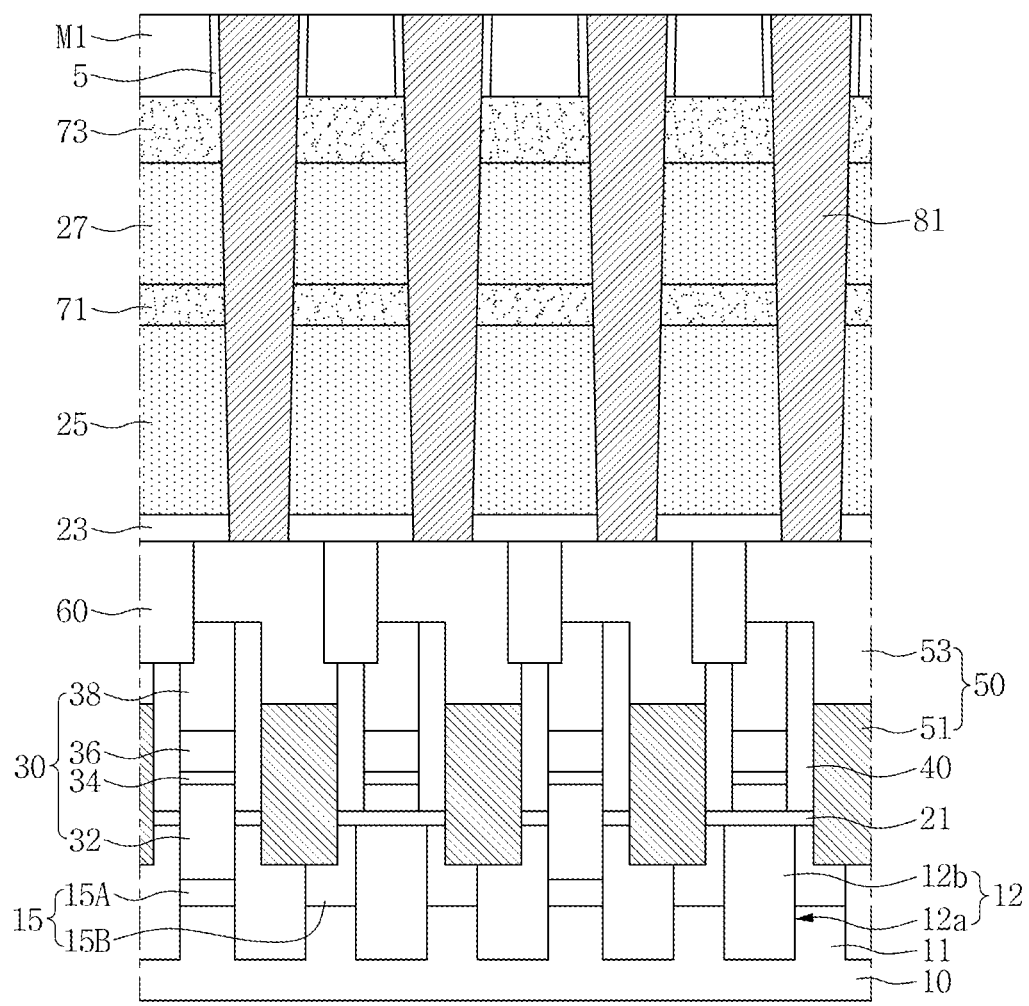

Referring to FIG. 8D, the method may include forming storage electrodes 81 filling the storage electrode holes H (see FIG. 8C).

Figure 8E:
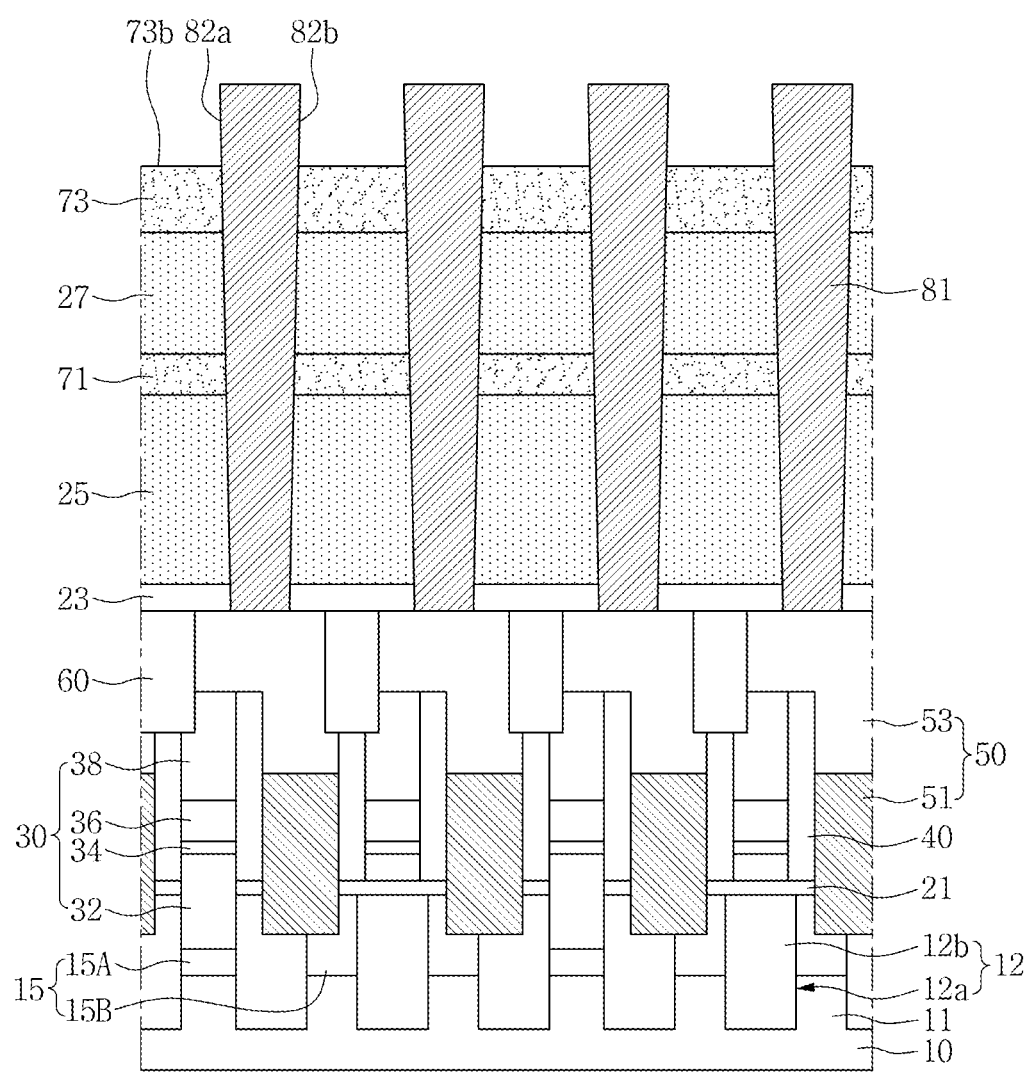

Referring to FIG. 8E, the method may include removing the first hard mask layer M1 by performing an etching process, and removing the spacers 5 by consecutively performing an etching process. In this process, an upper surface 73b of the second supporter 73 and side surfaces (also referred to herein as "sidewalls") 82a, 82b of the storage electrodes 81 may be exposed.

Figure 8F:
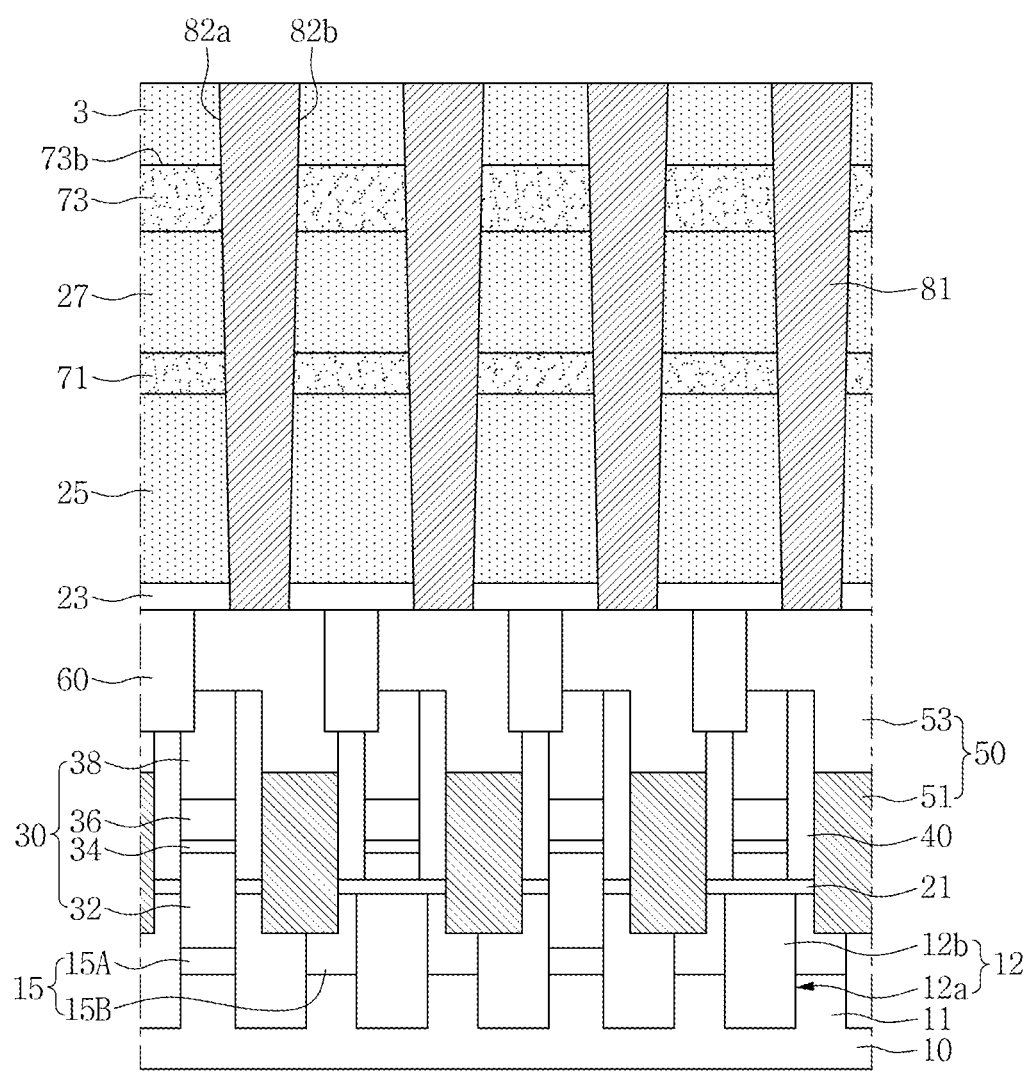

Referring to FIG. 8F, the method may include forming insulating patterns 3 covering the upper surfaces 73b of the second supporter 73 and surrounding the side surfaces 82a, 82b of the upper storage electrodes 81b.

Hereafter, the semiconductor device 100A in FIG. 1A may be formed by performing processes described with reference to FIG. 4D, FIG. 4E, FIG. 4F, and FIG. 4G and FIG. 2J, FIG. 2K, FIG. 2L, and FIG. 2M.

In the semiconductor device in accordance with some example embodiments of the inventive concepts, by using a mask layer disposed on an upper supporter as a storage electrode molding, a height of a storage electrode can increase in a thickness of the mask layer. Accordingly, an area of the storage electrode can increase, and thus a capacitance can increase.

Furthermore, by forming an uppermost supporter connecting upper portion of the storage electrode that protrudes from the upper supporter, it can prevent that the storage electrode located at a higher level than an upper surface of the upper supporter is bent.

Other various effects have been described in the above detailed description.

Although a few embodiments have been described, those skilled in the art will readily appreciate that many modifications are possible without materially departing from the novel teachings and advantages. Accordingly, all such modifications are intended to be included within the scope of this inventive concepts as defined in the claims.

What is claimed is:
1. A semiconductor device, comprising:
a plurality of via structures on a substrate;
an etch stop layer on the via structures;
a plurality of storage electrodes passing through the etch stop layer and in contact with an upper surface of separate ones of the via structures, each of the storage electrodes including
a first portion,
a second portion on the first portion,
a third portion on the second portion, and
an upper surface;
a first supporter configured to connect first portions of the storage electrodes;
a second supporter configured to connect second portions of the storage electrodes;
a third supporter configured to connect third portions of the storage electrodes, the third supporter having an upper surface, the upper surface of the third supporter being substantially coplanar with the upper surfaces of the storage electrodes; and
a third portion of a lower plate electrode configured to fill a space at least partially defined by an upper surface of the second supporter, a lower surface of the third supporter, and at least one sidewall of the storage electrodes,
wherein the first supporter is spaced apart from the etch stop layer.

2. The semiconductor device of claim 1, wherein
the first supporter and the second supporter are spaced apart according to a first spacing distance;
the second supporter and the third supporter are spaced apart according to a second spacing distance; and
the second spacing distance is smaller than the first spacing distance.

3. The semiconductor device of claim 1, wherein the third supporter is thicker than the second supporter in a vertical direction.

4. The semiconductor device of claim 1, wherein
each of the storage electrodes includes at least one sidewall; and
each of the first supporter, the second supporter, and the third supporter include separate, respective side surfaces, each of the side surfaces being in direct contact at least one sidewall of at least one of the storage electrodes.

5. The semiconductor device of claim 1, wherein each of the storage electrodes includes,
a lower storage electrode configured to extend from an upper surface of at least one of the via structures to a level that is coplanar with the upper surface of the second supporter; and
an upper storage electrode configured to extend from an upper surface of the lower storage electrode to a level that is coplanar with the upper surface of the third supporter.

6. The semiconductor device of claim 5, wherein the upper storage electrode is narrower than the lower storage electrode in a horizontal direction.

7. The semiconductor device of claim 1, further comprising:
a capacitor dielectric layer configured to conformally cover
an upper surface of the first supporter,
a lower surface of the first supporter,
the upper surface of the second supporter,
a lower surface of the second supporter,
the upper surface of the third supporter,
the lower surface of the third supporter,
at least one upper surface of the storage electrodes, and
at least one sidewall of the storage electrodes; and
an upper plate electrode on the lower plate electrode.

8. The semiconductor device of claim 7, wherein the lower plate electrode further includes,
a first portion configured to fill a space at least partially defined by the lower surface of the first supporter and at least one sidewall of the storage electrodes;
a second portion configured to fill a space at least partially defined by the upper surface of the first supporter, the lower surface of the second supporter, and at least one sidewall of the storage electrodes; and
a fourth portion configured to cover the upper surface of the third supporter and the upper surfaces of the storage electrodes.

9. The semiconductor device of claim 8, wherein the third portion of the lower plate electrode is narrower in a vertical direction than the second portion of the lower plate electrode.

10. The semiconductor device of claim 1, wherein at least one of the storage electrodes has a pillar shape.

11. A semiconductor device, comprising:
a plurality of via structures on a substrate;
an etch stop layer on the via structures;
a plurality of storage electrodes passing through the etch stop layer and in contact with upper surfaces of the via structures, each of the storage electrodes including
a first portion,
a second portion on the first portion,
a third portion on the second portion,
an upper surface, and
at least one sidewall;
a first supporter configured to connect first portions of the storage electrodes;
a second supporter configured to connect second portions of the storage electrodes;
a third supporter configured to connect third portions of the storage electrodes;
a capacitor dielectric layer configured to conformally cover
an upper surface of the first supporter,
a lower surface of the first supporter,
an upper surface of the second supporter,
a lower surface of the second supporter,
an upper surface of the third supporter,
a lower surface of the third supporter,
at least one upper surface of the storage electrodes, and
at least one sidewall of the storage electrodes; and
a lower plate electrode on the capacitor dielectric layer;
wherein the first supporter, the second supporter, and the third supporter are in direct contact with at least one sidewall of at least one of the storage electrodes, and
wherein a portion of the capacitor dielectric layer conformally covering both the upper surface of the third supporter and the upper surfaces of the storage electrodes has a planar profile,
wherein the first supporter is spaced apart from the etch stop layer,
wherein the lower plate electrode includes a third portion configured to fill a space at least partially defined by the upper surface of the second supporter, the lower surface of the third supporter, and at least one sidewall of the storage electrodes.

12. The semiconductor device of claim 11, wherein the third portion of each of the storage electrodes is narrower than the second portion of each of the storage electrodes in a horizontal direction.

13. The semiconductor device of claim 11, further comprising:
   an upper plate electrode on the lower plate electrode; and
   a capacitor capping insulating layer on the upper plate electrode.

14. The semiconductor device of claim 13, wherein the lower plate electrode includes titanium nitride (TiN), and the upper plate electrode includes at least one of silicon germanium (SiGe) and tungsten (W).

15. The semiconductor device of claim 11, further comprising:
   at least one bit line structure between at least two via structures of the plurality of via structures on the substrate; and
   a pad isolation region between one via structure of the via structures and one bit line structure of the at least one bit line structures;
   wherein the etch stop layer covers upper surfaces of the via structures and upper surfaces of the pad isolation region.

16. A semiconductor device, comprising:
   a plurality of storage electrodes on a substrate, each of the storage electrodes extending substantially orthogonal to a surface of the substrate, each of the storage electrodes including an upper surface that is a substrate-distal surface; and
   at least three supporters extending substantially parallel to the surface of the substrate, each supporter of the at least three supporters configured to couple each of the storage electrodes;
   an etch stop layer configured to cover upper surfaces of via structures on the substrate; and
   a lower plate electrode filling spaces between the at least three supporters,
   wherein the storage electrodes pass through the etch stop layer and are in contact with upper surfaces of the via structures,
   wherein each supporter of the at least three supporters is spaced apart from the etch stop layer.

17. The semiconductor device of claim 16, wherein each supporter of the at least three supporters has an upper surface that is substantially coplanar with the upper surfaces of the storage electrodes.

18. The semiconductor device of claim 16, wherein
   each supporter of the at least three supporters is configured to couple each of the storage electrodes.

19. The semiconductor device of claim 16, wherein each of the storage electrodes includes,
   a lower storage electrode and an upper storage electrode, the lower storage electrode and the upper storage electrode being coupled together at coupled portions, the coupled portions of the upper storage electrode and the lower storage electrode having different thicknesses in a horizontal direction.

20. The semiconductor device of claim 19, wherein the coupled portion of the upper storage electrode is narrower than the coupled portion of the lower storage electrode in the horizontal direction.

* * * * *